(12) United States Patent
Jo et al.

(10) Patent No.: US 11,971,564 B2
(45) Date of Patent: *Apr. 30, 2024

(54) DECORATIVE MEMBER AND MANUFACTURING METHOD THEREFOR

(71) Applicant: LG CHEM, LTD., Seoul (KR)

(72) Inventors: Pilsung Jo, Daejeon (KR); Song Ho Jang, Daejeon (KR); Yong Chan Kim, Daejeon (KR); Jeong Woo Shon, Daejeon (KR); Jin Suk Song, Daejeon (KR); Ki Hwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 937 days.

This patent is subject to a terminal disclaimer.

(21) Appl. No.: 16/768,289

(22) PCT Filed: Jul. 4, 2018

(86) PCT No.: PCT/KR2018/007584
§ 371 (c)(1),
(2) Date: Apr. 9, 2021

(87) PCT Pub. No.: WO2019/117413
PCT Pub. Date: Jun. 20, 2019

(65) Prior Publication Data
US 2023/0161089 A1 May 25, 2023

(30) Foreign Application Priority Data

Dec. 15, 2017 (KR) .................. 10-2017-0173250
Jan. 8, 2018 (KR) .................. 10-2018-0002278

(51) Int. Cl.
C03C 17/245 (2006.01)
A45C 11/00 (2006.01)
(Continued)

(52) U.S. Cl.
CPC ................ *G02B 5/26* (2013.01); *A45C 11/00* (2013.01); *B44F 1/045* (2013.01); *B44F 1/08* (2013.01);
(Continued)

(58) Field of Classification Search
CPC ... A45C 11/00; A45C 2011/002; B32B 27/28; B32B 3/00; B32B 3/30; B32B 33/00;
(Continued)

(56) References Cited

U.S. PATENT DOCUMENTS 3,338,730 A   8/1967   Slade et al.
6,344,288 B1  2/2002   Oyama et al.
(Continued)

FOREIGN PATENT DOCUMENTS

CN   2056903 U     5/1990
CN   101666886 A   3/2010
(Continued)

OTHER PUBLICATIONS

Yunxing Ling and Shenglian Xue, "Technical Manual 1 for Painting Ink", May 2009 (4 Pages).
(Continued)

*Primary Examiner* — Lawrence D Ferguson
(74) *Attorney, Agent, or Firm* — BRYAN CAVE LEIGHTON PAISNER LLP

(57) ABSTRACT

A decoration element is described. The decoration element includes a light reflective layer; a light absorbing layer provided on the light reflective layer; and a color developing layer comprising a color film, wherein the color developing layer is provided: on a surface of the light reflective layer opposite to a surface of the light reflective layer facing the light absorbing layer; between the light reflective layer and the light absorbing layer; or on a surface of the light
(Continued)

absorbing layer opposite to a surface of the light absorbing layer facing the light reflective layer.

14 Claims, 25 Drawing Sheets

(51) Int. Cl.
*B44F 1/04* (2006.01)
*B44F 1/08* (2006.01)
*C23C 14/00* (2006.01)
*C23C 14/18* (2006.01)
*C23C 14/20* (2006.01)
*C23C 14/34* (2006.01)
*G02B 5/08* (2006.01)
*G02B 5/26* (2006.01)
*B44C 3/02* (2006.01)

(52) U.S. Cl.
CPC ........ *C03C 17/245* (2013.01); *C23C 14/0036* (2013.01); *C23C 14/185* (2013.01); *C23C 14/205* (2013.01); *C23C 14/34* (2013.01); *G02B 5/085* (2013.01); *A45C 2011/002* (2013.01); *B44C 3/02* (2013.01); *C03C 2217/72* (2013.01); *C03C 2218/11* (2013.01); *C03C 2218/155* (2013.01)

(58) Field of Classification Search
CPC ... B32B 7/02; B44C 3/02; B44F 1/045; B44F 1/08; C03C 17/245; C03C 2217/72; C03C 2218/11; C03C 2218/155; C23C 14/0036; C23C 14/185; C23C 14/205; C23C 14/34; G02B 5/085; G02B 5/26
See application file for complete search history.

(56) References Cited

U.S. PATENT DOCUMENTS

| | | | |
|---|---|---|---|
| 6,350,509 B1 | 2/2002 | Sada et al. | |
| 6,569,517 B1 | 5/2003 | McGurran et al. | |
| 7,991,257 B1 | 8/2011 | Coleman | |
| 9,903,989 B2 | 2/2018 | Kim et al. | |
| 2003/0031842 A1 | 2/2003 | Marietti et al. | |
| 2005/0175815 A1 | 8/2005 | Wild et al. | |
| 2006/0077496 A1 | 4/2006 | Argoitia et al. | |
| 2006/0285184 A1 | 12/2006 | Phillips et al. | |
| 2010/0060987 A1 | 3/2010 | Witzman et al. | |
| 2011/0262713 A1 | 10/2011 | Nakao et al. | |
| 2013/0034693 A1 | 2/2013 | Fujii et al. | |
| 2013/0048072 A1 | 2/2013 | Choi | |
| 2014/0009838 A1 | 1/2014 | Weber et al. | |
| 2014/0377522 A1 | 12/2014 | Koch, III et al. | |
| 2015/0212244 A1 | 7/2015 | Kim et al. | |
| 2017/0052295 A1 | 2/2017 | Sakuma et al. | |
| 2017/0197874 A1 | 7/2017 | Dumont et al. | |
| 2017/0349998 A1 | 12/2017 | Yoshinari et al. | |
| 2018/0164932 A1 | 6/2018 | Park et al. | |
| 2018/0224960 A1 | 8/2018 | Park et al. | |
| 2018/0355467 A1 | 12/2018 | Lee et al. | |
| 2019/0098946 A1 | 4/2019 | Bee et al. | |
| 2019/0099967 A1 | 4/2019 | Bee et al. | |
| 2021/0061000 A1 | 3/2021 | Song et al. | |

FOREIGN PATENT DOCUMENTS

| | | | |
|---|---|---|---|
| CN | 102971862 A | 3/2013 | |
| CN | 104602909 A | 5/2015 | |
| CN | 106662950 A | 5/2017 | |
| CN | 107140827 A | 9/2017 | |
| EP | 1162059 A2 | 12/2001 | |
| EP | 2352042 A1 | 8/2011 | |
| EP | 2891554 A1 | 7/2015 | |
| EP | 2952360 A1 | 12/2015 | |
| EP | 3073353 A1 | 9/2016 | |
| EP | 3202565 A1 | 8/2017 | |
| EP | 3647053 A1 | 5/2020 | |
| IN | 201717016352 | 10/2017 | |
| JP | 3-86646 A | 4/1991 | |
| JP | 1997097011 A | 4/1997 | |
| JP | 200004613 A | 1/2000 | |
| JP | 2000-047613 A | 2/2000 | |
| JP | 2003118064 A | 4/2003 | |
| JP | 2006350355 A | 12/2006 | |
| JP | 2008083599 A | 4/2008 | |
| JP | 2009083183 A | 4/2009 | |
| JP | 2009120120 A | 6/2009 | |
| JP | 3153410 U | 9/2009 | |
| JP | 2009262466 A | 11/2009 | |
| JP | 2009269222 A | 11/2009 | |
| JP | 2010-82912 A | 4/2010 | |
| JP | 2010173273 A | 8/2010 | |
| JP | 2010197798 A | 9/2010 | |
| JP | 2011170295 A | 9/2011 | |
| JP | 5016722 B2 | 9/2012 | |
| JP | 2013037040 A | 2/2013 | |
| JP | 5317563 B2 | 10/2013 | |
| JP | 2016-79051 A | 5/2016 | |
| JP | 2017-526604 A | 9/2017 | |
| JP | 2017220150 A | 12/2017 | |
| KR | 10-20010066736 A | 7/2001 | |
| KR | 10-20030046522 A | 6/2003 | |
| KR | 10-0563419 B1 | 3/2006 | |
| KR | 10-20100120434 A | 11/2010 | |
| KR | 10-20140029333 A | 3/2014 | |
| KR | 1020150086329 A | 7/2015 | |
| KR | 10-2015-0114625 A | 10/2015 | |
| KR | 10-2017-0008572 A | 1/2017 | |
| KR | 10-2017-0086294 A | 7/2017 | |
| KR | 101874282 B1 | 7/2018 | |
| TW | 200944394 A1 | 11/2009 | |
| WO | 2014173974 A2 | 10/2014 | |
| WO | 2016136117 A1 | 9/2016 | |
| WO | 2017/099476 A1 | 6/2017 | |
| WO | 2017/104138 A1 | 6/2017 | |

OTHER PUBLICATIONS

Guangjiaoshili, "Digital SLR Shooting Tips-Composition", Oct. 2010, (3 Pages).

[FIG. 1A] Observing Direction
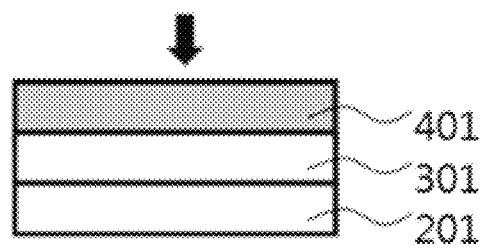
401
301
201
[FIG. 1B] Observing Direction
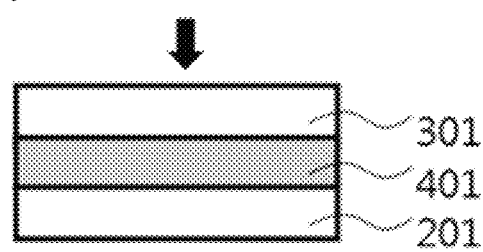
301
401
201
[FIG. 1C] Observing Direction
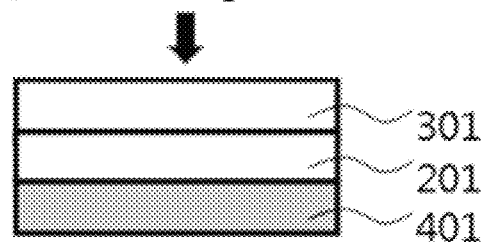
301
201
401

[FIG. 2A]
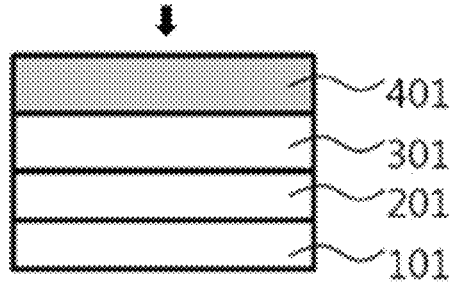
[FIG. 2B]
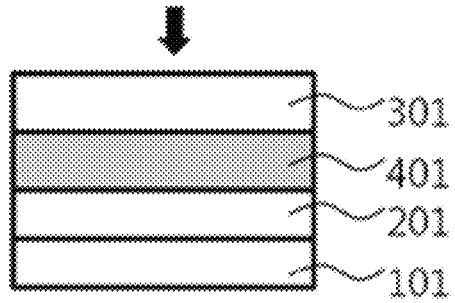
[FIG. 2C]
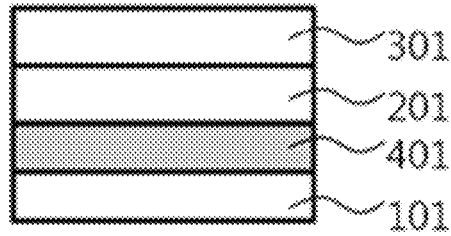
[FIG. 2D]
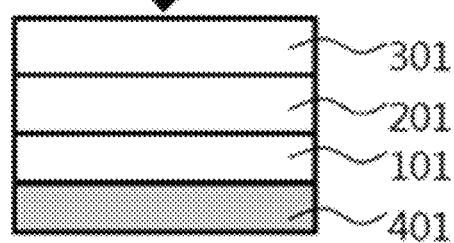
[FIG. 2E]
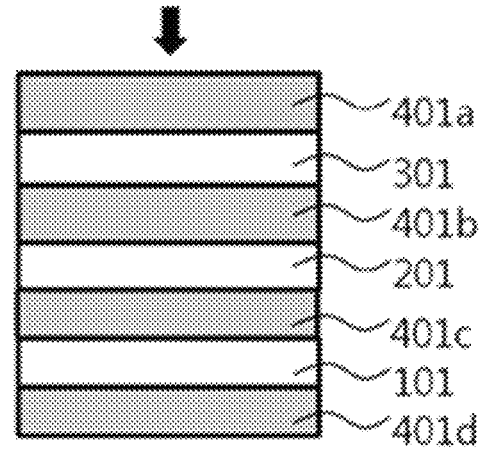

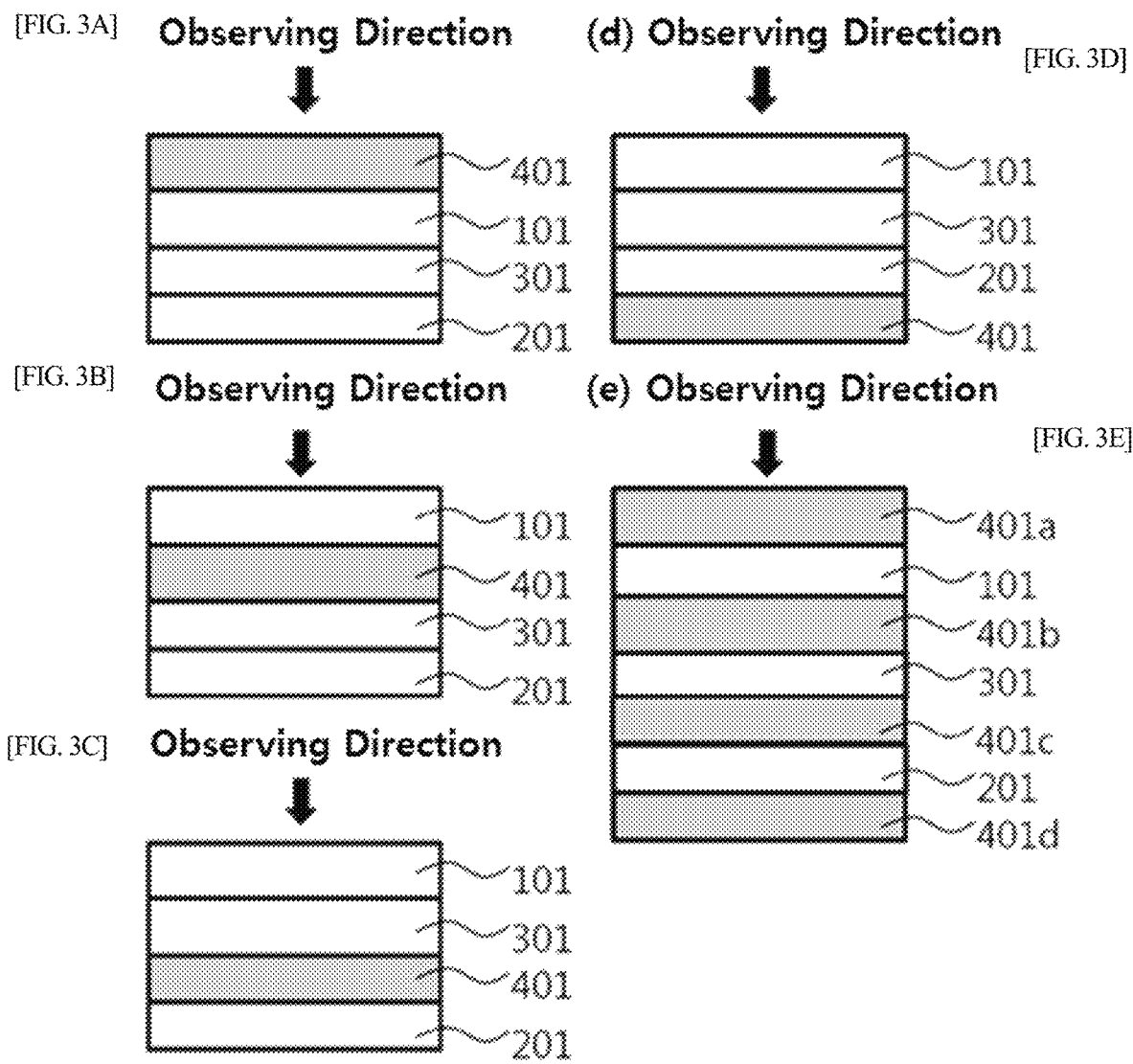

[FIG. 4]
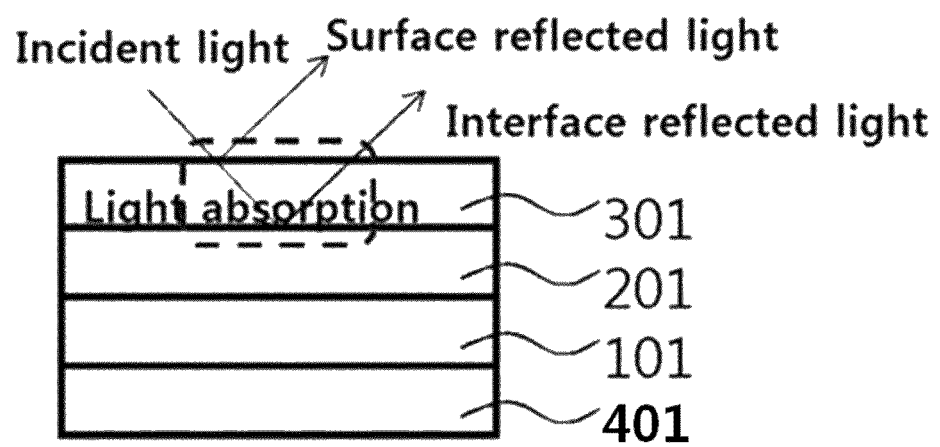

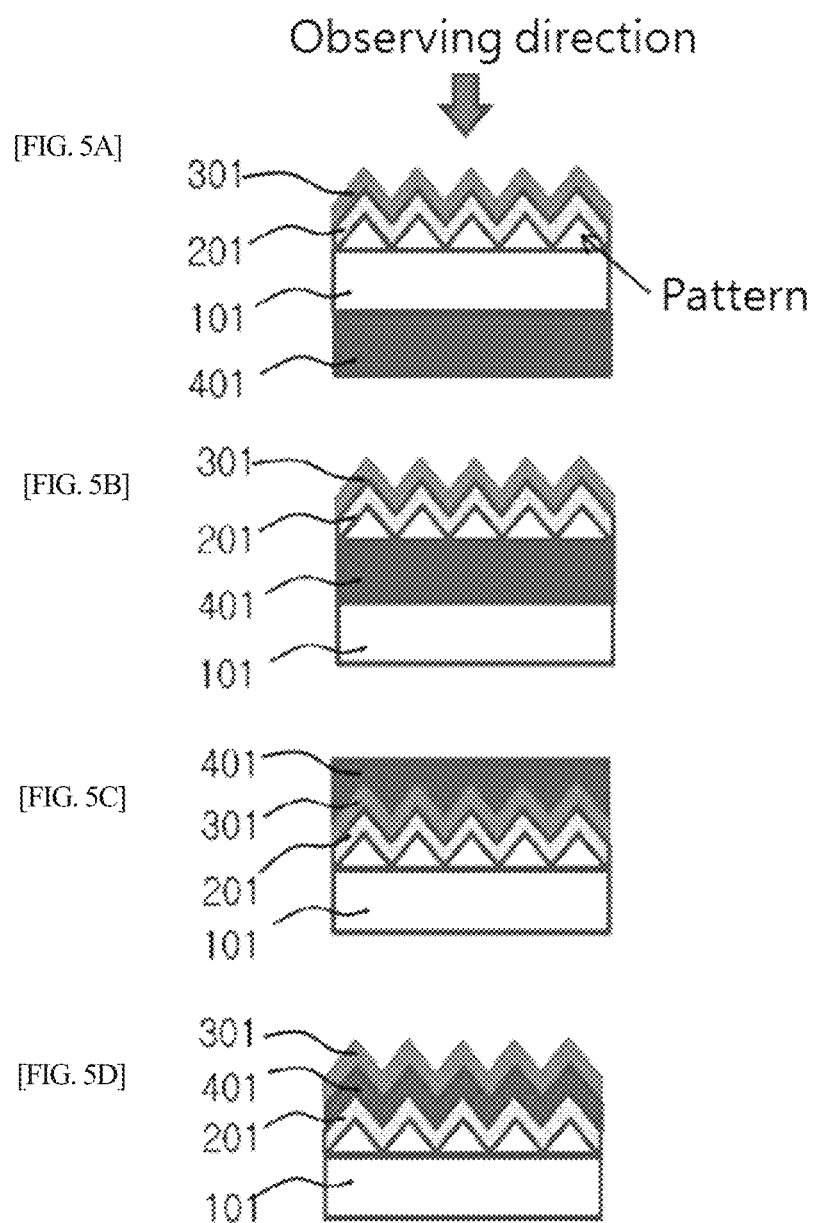

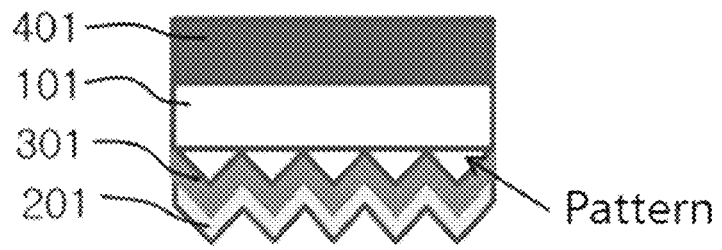
[FIG. 6A]
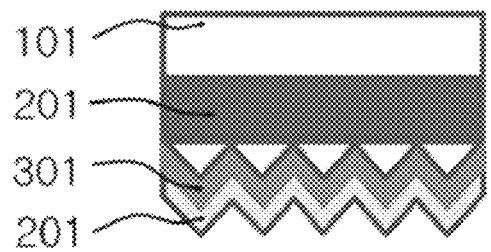
[FIG. 6B]
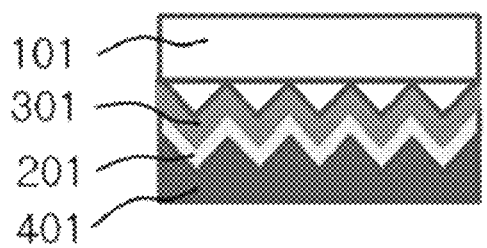
[FIG. 6C]
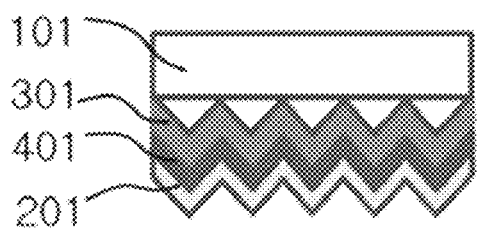
[FIG. 6D]

[FIG. 7]
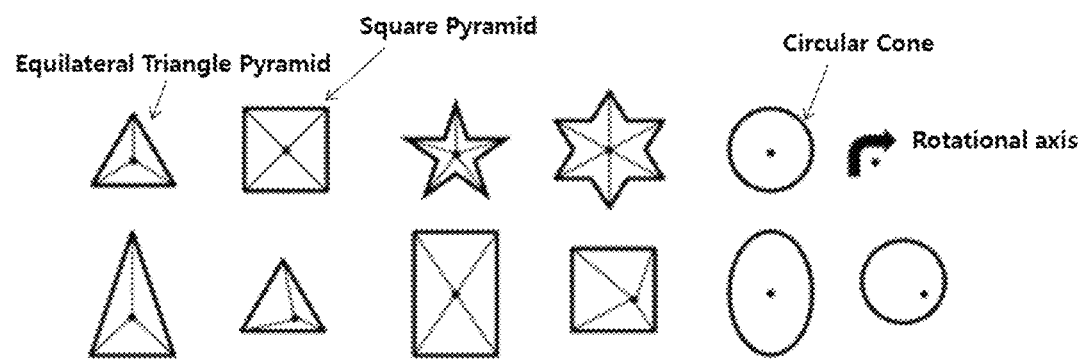
[FIG. 8]
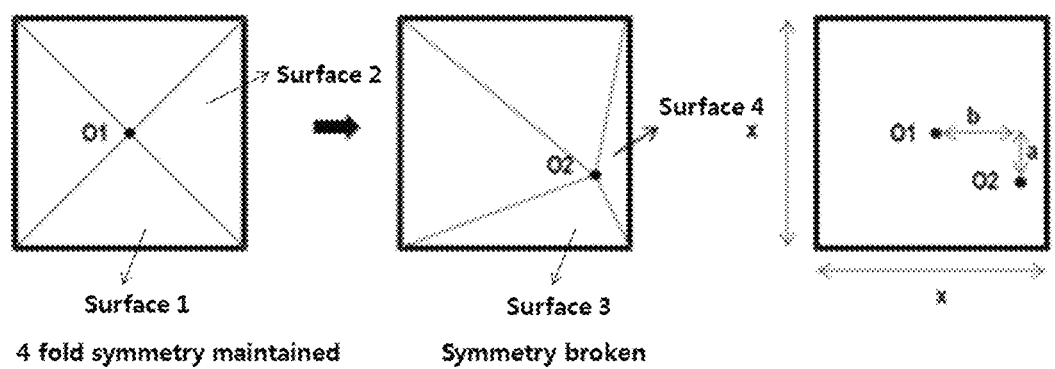

[FIG. 9A]
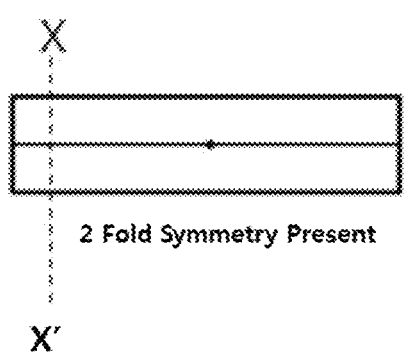
2 Fold Symmetry Present
[FIG. 9B]
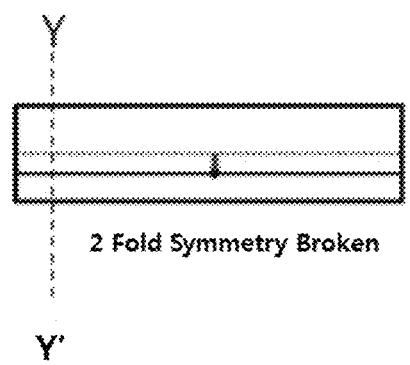
2 Fold Symmetry Broken
 Rotational axis
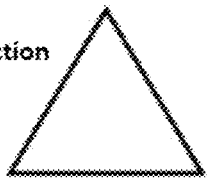
X-X' cross section
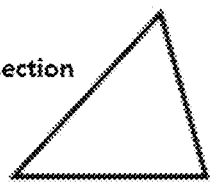
Y-Y' cross section

[FIG. 10A]
[FIG. 10B]
[FIG 10C]
[FIG. 10D]
[FIG. 10E]
[FIG. 10F]
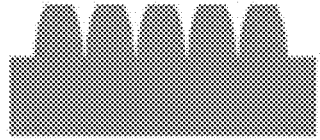
[FIG. 10G]
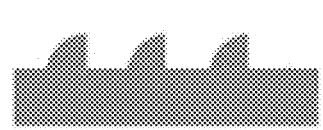
[FIG. 10H]
[FIG. 10I]
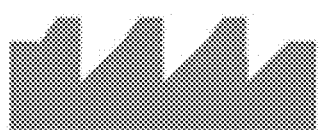

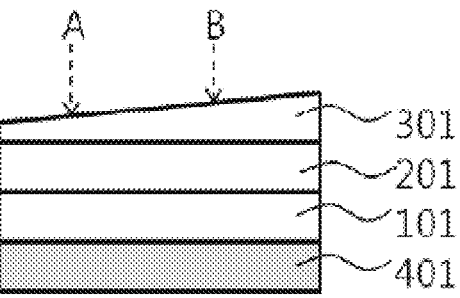
[FIG. 11A]
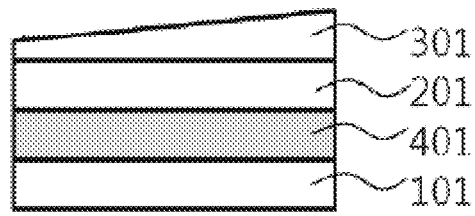
[FIG. 11B]
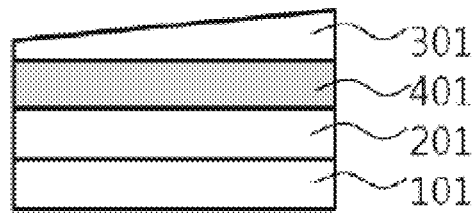
[FIG. 11C]
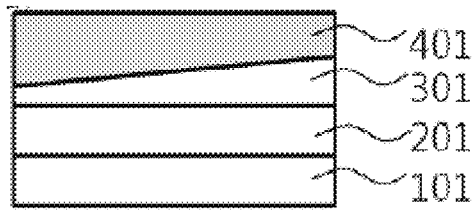
[FIG. 11D]

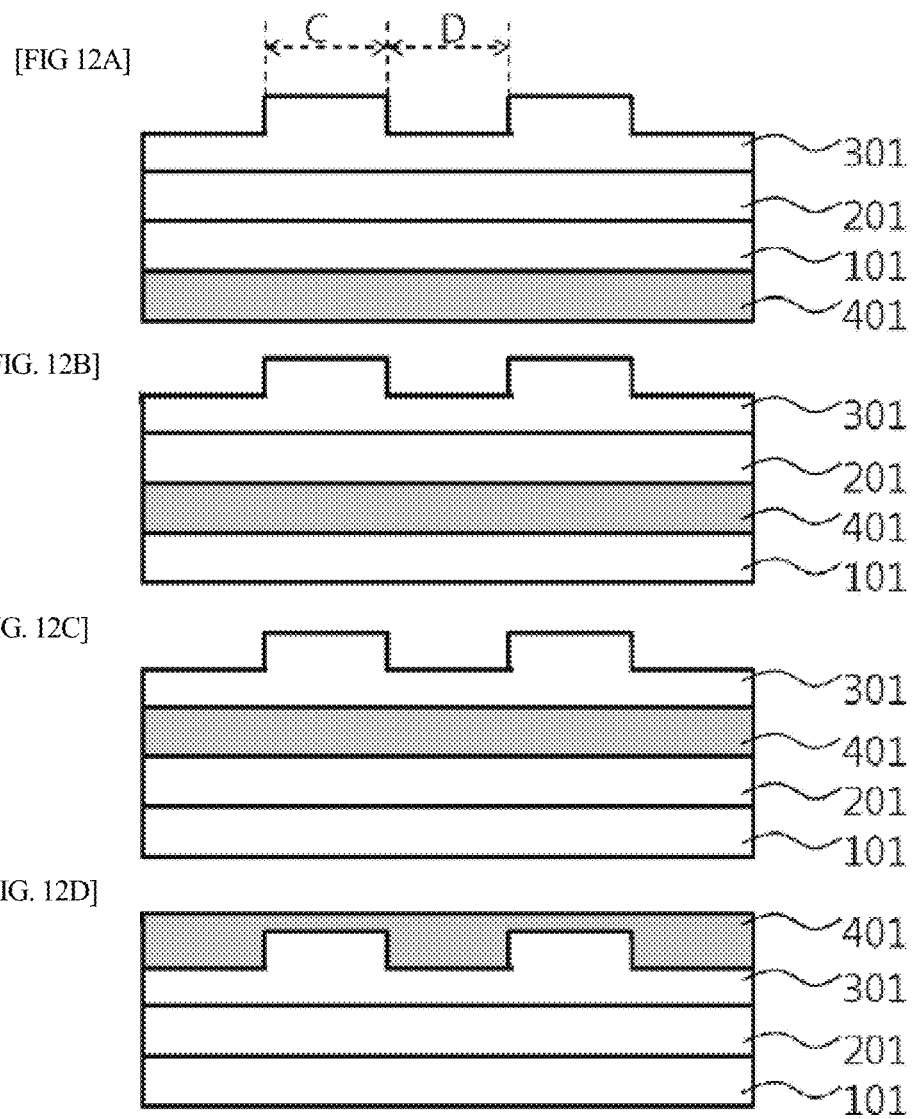

[FIG. 13]
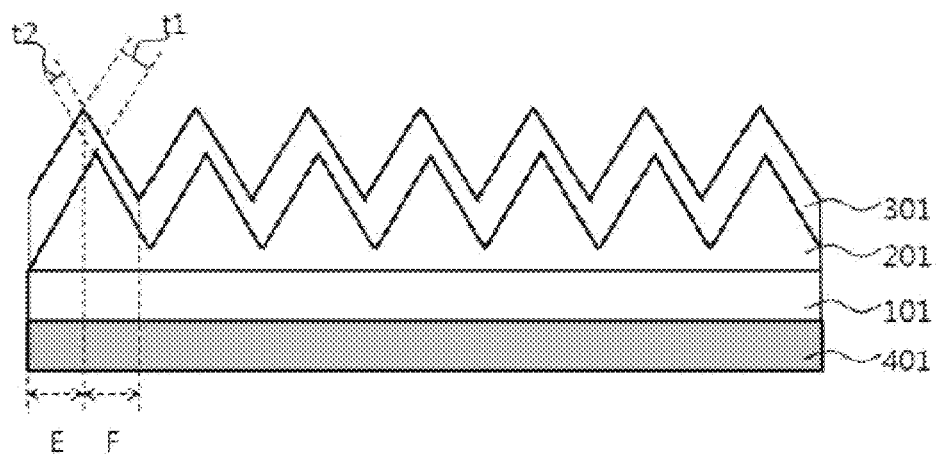
[FIG. 14]
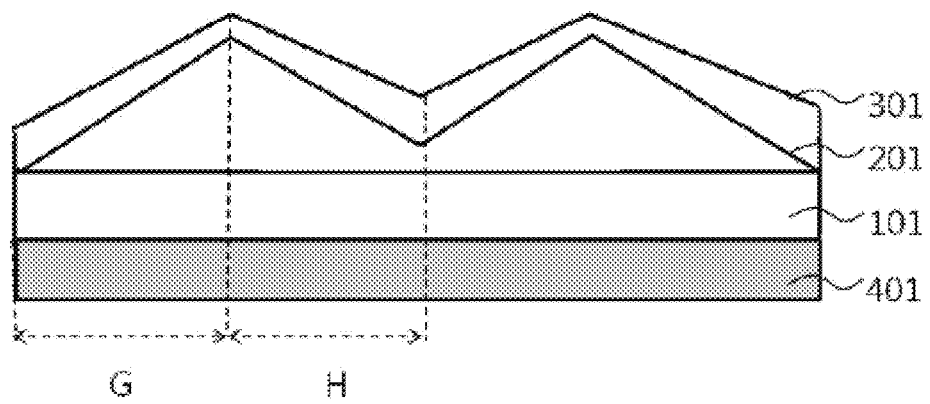

[FIG. 15]
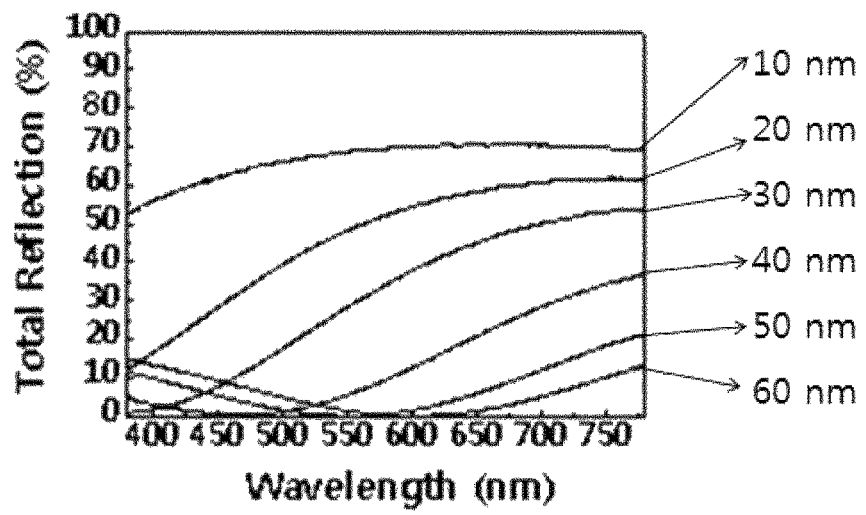
[FIG. 16]
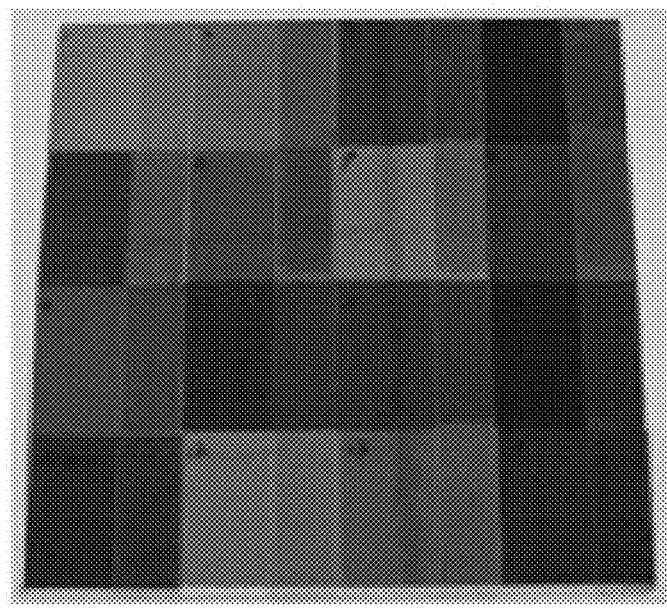

[FIG. 17]
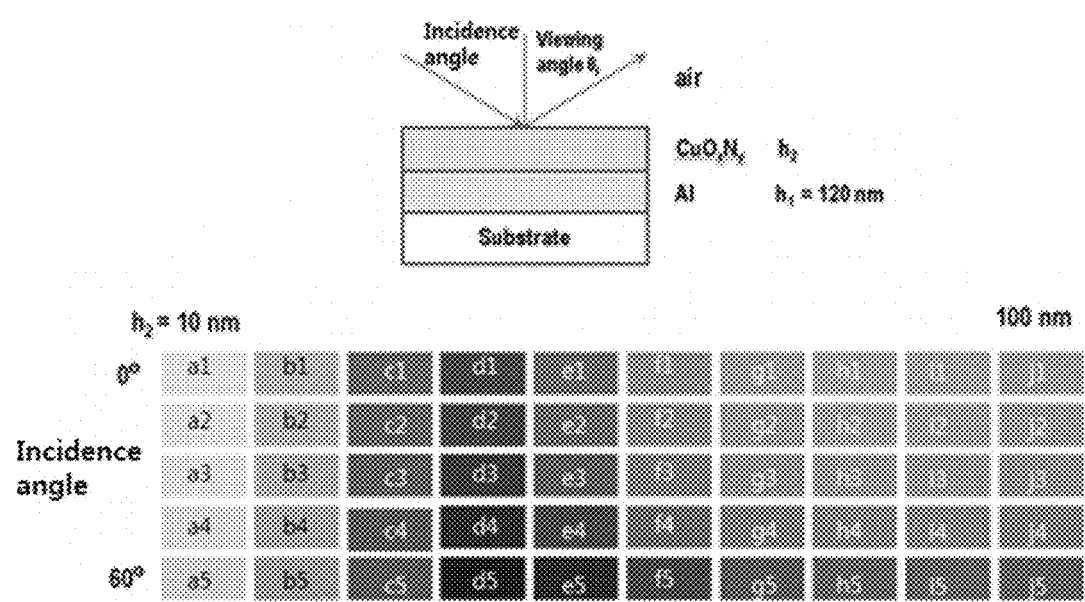

[FIG. 18]
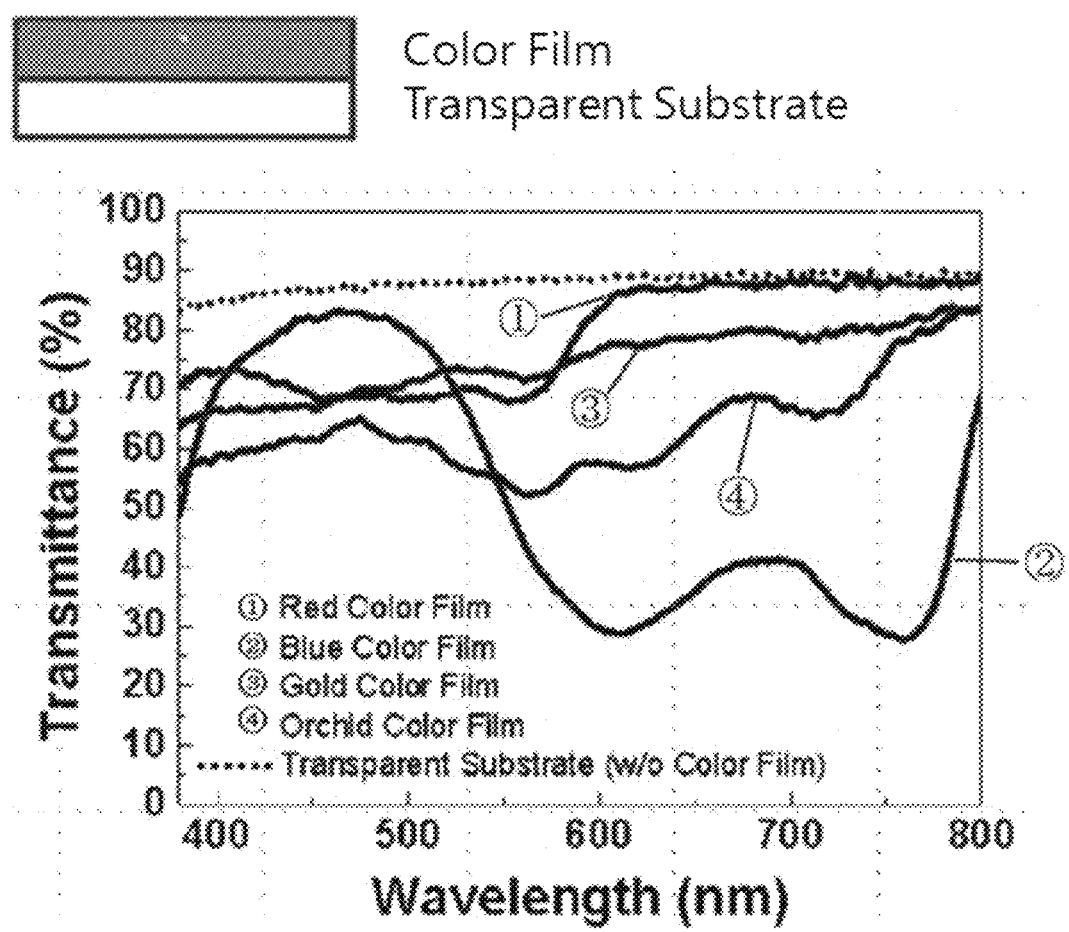

[FIG. 19]
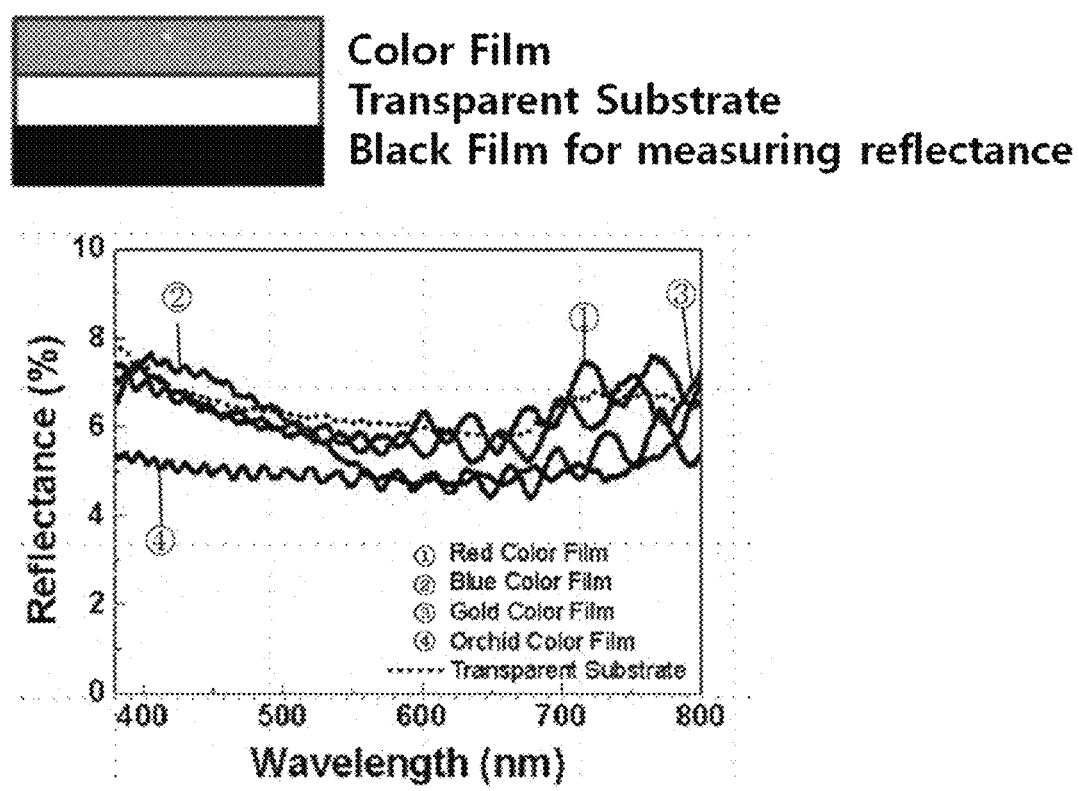

[FIG. 20]
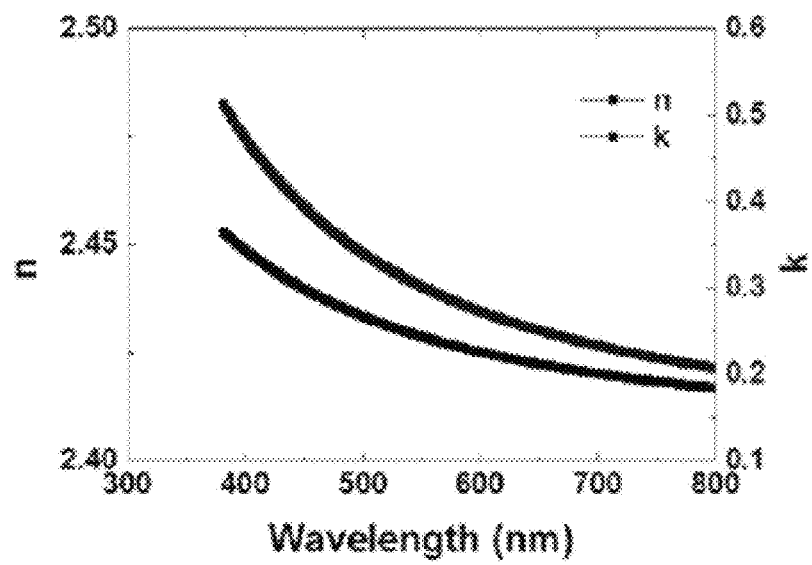
[FIG. 21]
| | L* | a* | b* | Color | (ΔE*ab) |
|---|---|---|---|---|---|
| Comparative Example 1 | 71 | 2.82 | 17.43 | | 0 |
| Example 1 | 38.07 | -8.07 | -2.51 | | 40.01 |
| Comparative Example 2 | 37.52 | -3.06 | -7.51 | | 0 |
| Example 2 | 34.38 | -2.15 | -11.08 | | 5.54 |

[FIG. 22]
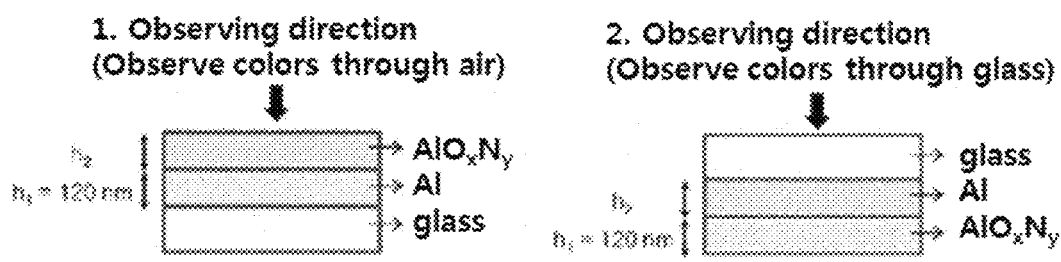
Comparative Example 3. Observe colors through air, $h_2$=10~100nm
Comparative Example 4. Observe colors through glass, $h_2$=10~100nm
Comparative Example 5. Observe colors through air, $h_2$=120~300nm
Comparative Example 6. Observe colors through glass, $h_2$=120~300nm
$h_2$: light absorbing layer thickness

[FIG. 23]
1. Observing direction
(Observe colors through air)
2. Observing direction
(Observe colors through glass)
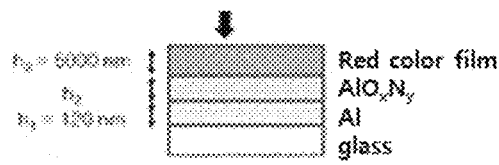
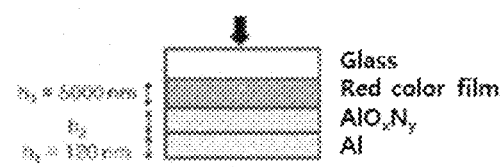
Example 3. Observe colors through air, $h_2$=10~100nm
Example 4. Observe colors through glass, $h_2$=10~100nm
Example 5. Observe colors through air, $h_2$=120~300nm
Example 6. Observe colors through glass, $h_2$=120~300nm
$h_2$: light absorbing layer thickness

[FIG. 24]

1. Observing direction
(Observe colors through air)

2. Observing direction
(Observe colors through glass)

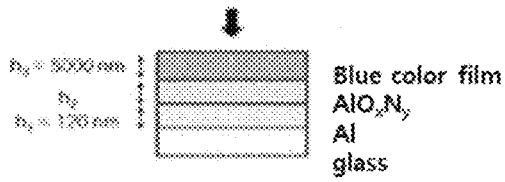
Blue color film
AlO$_x$N$_y$
Al
glass

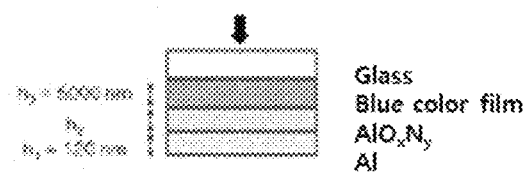
Glass
Blue color film
AlO$_x$N$_y$
Al

Example 7. Observe colors through air, h$_2$=10~100nm

Example 8. Observe colors through glass, h$_2$=10~100nm

Example 9. Observe colors through air, h$_2$=120~300nm

Example 10. Observe colors through glass, h$_2$=120~300nm

h$_2$: light absorbing layer thickness

[FIG. 25]
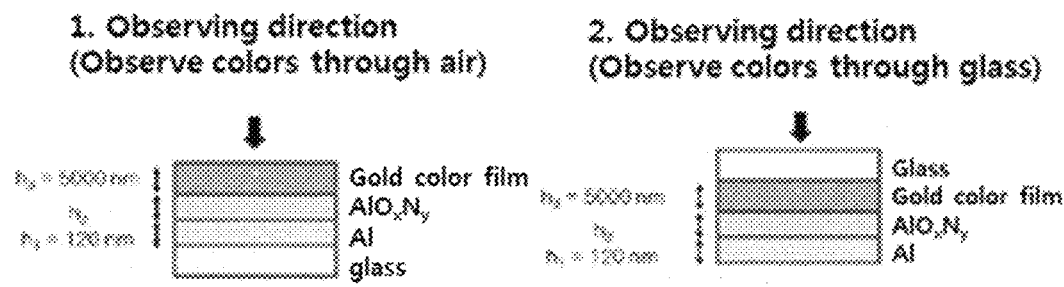
Example 11. Observe colors through air, $h_2$=10~100nm
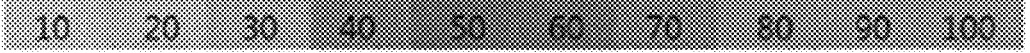
Example 12. Observe colors through glass, $h_2$=10~100nm
Example 13. Observe colors through air, $h_2$=120~300nm
Example 14. Observe colors through glass, $h_2$=120~300nm
$h_2$: light absorbing layer thickness

[FIG. 26]
1. Observing direction
(Observe colors through air)
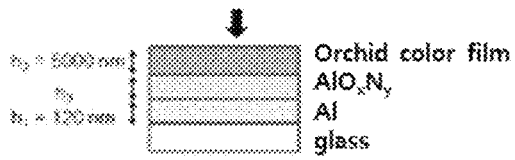
2. Observing direction
(Observe colors through glass)
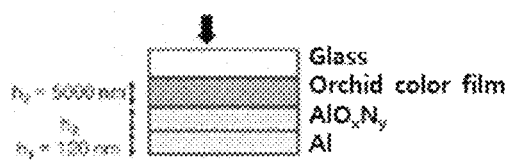
Example 15. Observe colors through air, $h_2$=10~100nm
Example 16. Observe colors through glass, $h_2$=10~100nm
Example 17. Observe colors through air, $h_2$=120~300nm
Example 18. Observe colors through glass, $h_2$=120~300nm
$h_2$: light absorbing layer thickness

[FIG. 27]

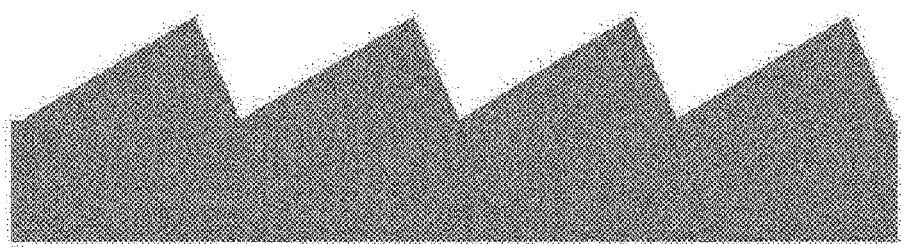

[FIG. 28]

|  | 30nm/10nm | | 80nm/30nm | | 140nm/50nm | |
|---|---|---|---|---|---|---|
| Observe through air | Dichroic Decoration element 1 | | Dichroic Decoration element 2 | | Dichroic Decoration element 3 | |
|  | Left View | Right View | Left View | Right View | Left View | Right View |
| No color film Comparative example 7 to 9 | 1La | 1Ra | 2La | 2Ra | 3La | 3Ra |
| Add Red color film Example 19 to 21 | 1Lb | 1Rb | 2Lb | 2Rb | 3Lb | 3Rb |
| Add Blue color film Example 22 to 24 | 1Lc | 1Rc | 2Lc | 2Rc | 3Lc | 3Rc |
| Add Gold color film Example 25 to 27 | 1Ld | 1Rd | 2Ld | 2Rd | 3Ld | 3Rd |

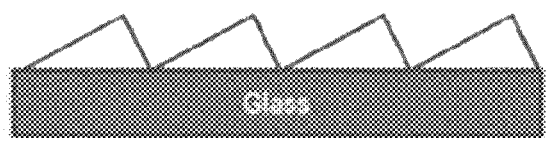

   

High Angle     Low Angle

[FIG. 29]

| Observe through air | 30nm/10nm Dichroic Decoration element 4 | | 80nm/30nm Dichroic Decoration element 5 | | 140nm/50nm Dichroic Decoration element 6 | |
|---|---|---|---|---|---|---|
| | Left View | Right View | Left View | Right View | Left View | Right View |
| No color film Comparative example 10 to 12 | 4La | 4Ra | 5Lа | 5Ra | 6La | 6Ra |
| Add Red color film Example 28 to 30 | 4Lb | 4Rb | 5Lb | 5Rb | 6Lb | 6Rb |
| Add Blue color film Example 31 to 33 | 4Lc | 4Rc | 5Lc | 5Rc | 6Lc | 6Rc |
| Add Gold color film Example 34 to 36 | 4Ld | 4Rd | 5Ld | 5Rd | 6Ld | 6Rd |

[FIG. 30]
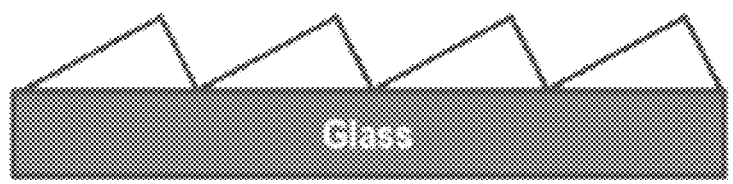
 High Angle
 Low Angle
[FIG. 31]
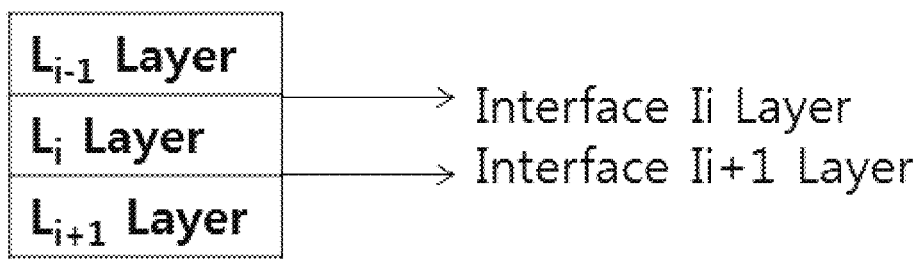

DECORATIVE MEMBER AND MANUFACTURING METHOD THEREFOR

This application is a U.S. national stage of international Application No. PCT/KR2018/007584, filed Jul. 4, 2018, and claims priority from Korean Application Nos. 10-2017-0173250, filed Dec. 15, 2017, and 10-2018-0002278, filed Jan. 8, 2018, the contents of which are incorporated herein in their entirety as if fully set forth herein.

TECHNICAL FIELD

Described herein is a decoration element and a method for preparing the same. In particular, the present disclosure relates to a decoration element for use in mobile devices or electronic products, and a method for preparing the same.

BACKGROUND

For mobile phones, various mobile devices and electronic products, product designs such as colors, shapes and patterns play a major role in providing values of products to customers in addition to product functions. Product preferences and prices are also dependent on designs.

As for mobile phones as one example, various colors and color senses are obtained using various methods and used in products. A method of providing colors to a mobile phone case material itself or a method of providing designs by attaching a deco film implementing colors and shapes to a case material may be included.

In existing deco films, attempts have been made to develop colors through methods such as printing and deposition. When expressing heterogeneous colors on a single surface, printing needs to be conducted two or more times, and implementation is hardly realistic when to apply various colors to a three-dimensional pattern. In addition, existing deco films have fixed colors depending on a viewing angle, and even when there is a slight change, the change is limited to just a difference in the color sense.

SUMMARY

The present disclosure is directed to providing a decoration element capable of readily obtaining various colors, capable of obtaining a number of colors on a three-dimensional pattern as necessary, and capable of providing color changes depending on a viewing angle.

One embodiment of the present application provides a decoration element comprising a light reflective layer; a light absorbing layer provided on the light reflective layer; and a color developing layer comprising a color film provided on a surface opposite to the surface facing the light absorbing layer of the light reflective layer, between the light reflective layer and the light absorbing layer, or on a surface opposite to the surface facing the light reflective layer of the light absorbing layer.

According to another embodiment of the present application, the color film employs a color difference ΔE*ab, a difference in L*a*b* in a color coordinate CIE L*a*b* of the color developing layer, to be greater than 1 when the color film is present compared to when the color film is not provided.

According to another embodiment of the present application, a substrate is provided on a surface opposite to the surface facing the light absorbing layer of the light reflective layer, or on a surface opposite to the surface facing the light reflective layer of the light absorbing layer. When the substrate is provided on a surface opposite to the surface facing the light absorbing layer of the light reflective layer and the color film is located on a surface opposite to the surface facing the light absorbing layer of the light reflective layer, the color film may be provided between the substrate and the light reflective layer, or on a surface opposite to the surface facing the light reflective layer of the substrate. When the substrate is provided on a surface opposite to the surface facing the light reflective layer of the light absorbing layer and the color film is located on a surface opposite to the surface facing the light reflective layer of the light absorbing layer, the color film may be provided between the substrate and the light absorbing layer, or on a surface opposite to the surface facing the light absorbing layer of the substrate.

According to another embodiment of the present application, the substrate is provided on a surface opposite to the surface facing the light absorbing layer of the light reflective layer, and the color film may be provided between the substrate and the light reflective layer, or on a surface opposite to the surface facing the light reflective layer of the substrate.

According to another embodiment of the present application, the substrate is provided on a surface opposite to the surface facing the light reflective layer of the light absorbing layer, and the color film may be provided between the substrate and the light absorbing layer, or on a surface opposite to the surface facing the light absorbing layer of the substrate.

Herein, the color film may be provided as one sheet, or as a laminate of 2 sheets or more that are the same or different types.

According to another embodiment of the present application, the light absorbing layer comprises two or more points with different thicknesses.

According to another embodiment of the present application, the light absorbing layer comprises two or more regions with different thicknesses.

According to another embodiment of the present application, the light absorbing layer comprises one or more regions in which an upper surface has an inclined surface with an inclined angle of greater than 0 degrees and less than or equal to 90 degrees, and the light absorbing layer comprises one or more regions having a thickness different from a thickness in any one region having the inclined surface.

According to another embodiment of the present application, the light absorbing layer comprises one or more regions with a gradually changing thickness.

According to another embodiment of the present application, the light absorbing layer comprises one or more regions in which an upper surface has an inclined surface with an inclined angle of greater than 0 degrees and less than or equal to 90 degrees, and at least one region having the inclined surface has a structure in which a thickness of the light absorbing layer gradually changes.

According to another embodiment of the present application, the light absorbing layer has an extinction coefficient (k) value of greater than 0 and less than or equal to 4 at 400 nm.

According to another embodiment of the present application, the decoration element is a deco film, a case of a mobile device, a case of an electronic product, or a commodity requiring color decoration.

According to embodiments described in the present specification, light absorption occurs in each of an entering path when external light enters through a color developing layer and in a reflection path when reflected, and since external light is reflected on each of a light absorbing layer surface and a light reflective layer surface, constructive interference and destructive interference phenomena occur between reflected light on the light absorbing layer surface and reflected light on the light reflective layer surface. Specific colors may be developed through such light absorption in the entering path and the reflection path, and the constructive interference and destructive interference phenomena. Accordingly, specific colors may be obtained according to light reflective layer material-dependent reflectance spectra and according to light absorbing layer compositions. In addition, since developed colors are thickness dependent, colors may vary depending on thicknesses even when having the same material composition. In addition, by being further provided with a color film, the width of obtainable colors can be much further increased even when materials and thicknesses of the light reflective layer and the light absorbing layer are determined. The width of color changes obtained by the color film addition may be defined by a color difference ($\Delta E^*ab$), a difference in $L^*a^*b^*$ before and after applying the color film. Furthermore, a plurality of colors can be developed by allowing the light absorbing layer to have two or more points or regions with different thicknesses on the same surface, and by forming a color developing layer on a three-dimensional pattern, various colors can be obtained on the three-dimensional pattern.

In addition, when an upper surface of the light absorbing layer has at least one inclined surface, changes in the developed colors can be obtained depending on a viewing angle, and the light absorbing layer can be prepared to have two or more regions with different thicknesses using a simple process.

BRIEF DESCRIPTION OF DRAWINGS

FIGS. 1A to 1C, 2A to 2E and 3A to 3E illustrate laminated structures of a decoration element according to various exemplary embodiments.

FIG. 4 is a mimetic diagram describing a working principle of color development in a light reflective layer and light absorbing layer structure.

FIGS. 5A to 5D and 6A to 6D illustrate laminated structures of a decoration element according to various exemplary embodiments.

FIGS. 7, 8, 9A, 9B and 10A to 10I illustrate upper surface structures of light absorbing layers of a decoration element according to various exemplary embodiments FIGS. 11A to 11D, 12A to 12D, 13 and 14 illustrate laminated structures of a decoration element according to various embodiments.

FIG. 15 to FIG. 17 show the dependence of color development depending on a thickness of a light absorbing layer.

FIGS. 18 and 19 are plots of the light transmittance and light reflectance, respectively, of color films used in the working Examples described herein.

FIG. 20 is a graph showing n and k values of aluminum oxynitride.

FIG. 21 shows colors of decoration elements prepared in Comparative Examples 1 and 2 and Examples 1 and 2.

FIGS. 22 to 26 show colors of decoration elements prepared in Comparative Examples 3 to 6 and Examples 3 to 18.

FIG. 27 shows a cross-sectional structure of a PET substrate or glass having a dichroic pattern used in Examples 19 to 36 and Comparative Examples 7 and 8.

FIG. 28 shows colors of decoration elements prepared in Examples 19 to 27 and Comparative Examples 7 to 9.

FIG. 29 shows colors of decoration elements prepared in Examples 28 to 36 and Comparative Examples 10 to 12.

FIG. 30 shows colors of decoration elements prepared in Example 37 and Comparative Example 13.

FIG. 31 illustrates a method of distinguishing between a light absorbing layer and a light reflective layer.

DETAILED DESCRIPTION

Hereinafter, the present disclosure will be described in detail.

In the present specification, a "point" means one position that does not have an area. In the present specification, the expression is used to indicate that a light absorbing layer has two or more points with different thicknesses.

In the present specification, a "region" represents a part having a certain area. For example, when placing the decoration element on the ground so that a light reflective layer is placed at the bottom and the light absorbing layer is placed at the top and dividing both ends of the inclined surface or both ends with the same thickness perpendicular with respect to the ground, the region having an inclined surface means an area divided by the both ends of the inclined surface, and the region with the same thickness means an area divided by the both ends with the same thickness.

In the present specification, a "surface" or "region" may be a flat surface, but is not limited thereto, and a part or all may be a curved surface. For example, structures in which a vertical cross-section shape is a part of an arc of a circle or oval, a wave structure, a zigzag or the like may be included.

In the present specification, an "inclined surface" means, when placing the decoration member on the ground so that a light reflective layer is placed at the bottom and the light absorbing layer is placed at the top, a surface having an angle formed by the upper surface with respect to the ground of greater than 0 degrees and less than or equal to 90 degrees.

In the present specification, a "thickness" of a certain layer means a shortest distance from a lower surface to an upper surface of the corresponding layer.

In the present specification, "or" represents, unless defined otherwise, a case of selectively or all comprising those listed, that is, a meaning of "and/or".

In the present specification, a "layer" means covering 70% or more of an area where the corresponding layer is present. It means covering preferably 75% or more, and more preferably 80% or more.

A decoration element according to one embodiment of the present application comprises a light reflective layer; a light absorbing layer provided on the light reflective layer; and a color developing layer comprising a color film provided on a surface opposite to the surface facing the light absorbing layer of the light reflective layer, between the light reflective layer and the light absorbing layer, or on a surface opposite to the surface facing the light reflective layer of the light absorbing layer.

When the color film is present compared to when the color film is not provided, the color film is not particularly limited as long as it has a color difference $\Delta E^*ab$, a distance in space of $L^*a^*b^*$ in a color coordinate CIE $L^*a^*b^*$ of the color developing layer, of greater than 1.

Colors may be expressed by CIE $L^*a^*b^*$, and a color difference may be defined using a distance ($\Delta E^*ab$) in the $L^*a^*b^*$ space. Specifically, the color difference is $\Delta E^*ab = \sqrt{(\Delta L)^{2}+(\Delta a)^{2}+(\Delta b)^{2}}$, and within a range of $0 < \Delta E^*ab < 1$, an observer may not recognize the color difference [reference document: Machine Graphics and Vision 20(4):383-41]. Accordingly, a color difference obtained by the color film addition may be defined by ΔE*ab>1 in the present specification.

FIG. 1A illustrates a structure in which a light reflective layer (201), a light absorbing layer (301) and a color film (401) are consecutively laminated, FIG. 1B illustrates a structure in which a light reflective layer (201), a color film (401) and a light absorbing layer (301) are consecutively laminated, and FIG. 1C illustrates a structure in which a color film (401), a light reflective layer (201) and a light absorbing layer (301) are consecutively laminated.

The color film may also perform a role of a substrate. For example, those that may be used as a substrate may be used as a color film by adding a pigment or a dye thereto.

The substrate may be provided on a surface opposite to the surface facing the light absorbing layer of the light reflective layer; or on a surface opposite to the surface facing the light reflective layer of the light absorbing layer.

For example, when the substrate is provided on a surface opposite to the surface facing the light absorbing layer of the light reflective layer, and the color film is located on a surface opposite to the surface facing the light absorbing layer of the light reflective layer, the color film may be provided between the substrate and the light reflective layer; or on a surface opposite to the surface facing the light reflective layer of the substrate. As another example, when the substrate is provided on a surface opposite to the surface facing the light reflective layer of the light absorbing layer, and the color film is located on a surface opposite to the surface facing the light reflective layer of the light absorbing layer, the color film may be provided between the substrate and the light absorbing layer; or on a surface opposite to the surface facing the light absorbing layer of the substrate.

According to another embodiment of the present application, the substrate is provided on a surface opposite to the surface facing the light absorbing layer of the light reflective layer, and the color film is further provided. FIG. 2A illustrates a structure in which the color film (401) is provided on a surface opposite to the light reflective layer (201) side of the light absorbing layer (301), FIG. 2B illustrates a structure in which the color film (401) is provided between the light absorbing layer (301) and the light reflective layer (201), FIG. 2C illustrates a structure in which the color film (401) is provided between the light reflective layer (201) and the substrate (101), and FIG. 2D illustrates a structure in which the color film (401) is provided on a surface opposite to the light reflective layer (201) side of the substrate (101). FIG. 2E illustrates a structure in which the color films (401a, 401b, 401c, 401d) are provided on a surface opposite to the light reflective layer (201) side of the light absorbing layer (301), between the light absorbing layer (301) and the light reflective layer (201), between the light reflective layer (201) and the substrate (101), and on a surface opposite to the light reflective layer (201) side of the substrate (101), respectively, however, the structure is not limited thereto, and 1 to 3 of the color films (401a, 401b, 401c, 401d) may not be included.

According to another embodiment of the present application, the substrate is provided on a surface opposite to the surface facing the light reflective layer of the light absorbing layer, and the color film is further provided. FIG. 3A illustrates a structure in which the color film (401) is provided on a surface opposite to the light absorbing layer (301) side of the substrate (101), FIG. 3B illustrates a structure in which the color film (401) is provided between the substrate (101) and the light absorbing layer (301), FIG. 3C illustrates a structure in which the color film (401) is provided between the light absorbing layer (301) and the light reflective layer (201), and FIG. 3D illustrates a structure in which the color film (401) is provided on a surface opposite to the light absorbing layer (301) side of the light reflective layer (201). FIG. 3E illustrates a structure in which the color films (401a, 401b, 401c, 401d) are provided on a surface opposite to the light absorbing layer (201) side of the substrate (101), between the substrate (101) and the light absorbing layer (301), between the light absorbing layer (301) and the light reflective layer (201), and on a surface opposite to the light absorbing layer (201) side of the light reflective layer (201), respectively, however, the structure is not limited thereto, and 1 to 3 of the color films (401a, 401b, 401c, 401d) may not be included.

In the structures illustrated in FIG. 2B and FIG. 3C, the light reflective layer may reflect light entering through the color film when the color film has visible light transmittance of greater than 0%, and therefore, colors may be obtained by laminating the light absorbing layer and the light reflective layer.

In the structures illustrated in FIG. 2C, FIG. 3D and FIG. 3D, light transmittance of the colors developed from the color film of the light reflective layer (201) may be 1% or greater, preferably 3% or greater and more preferably 5% or greater so that changes in the color difference obtained by the color film addition may be recognized. This is due to the fact that light transmitted in such a visible light transmittance range may be mixed with colors obtained by the color film.

The color film may be provided as one sheet, or as a laminate of 2 sheets or more that are the same or different types.

As the color film, those capable of developing target colors by combining with colors developed from the laminated structure of the light reflective layer and the light absorbing layer described above may be used. For example, color films expressing colors by one, two or more types of pigments and dyes being dispersed into a matrix resin may be used. Such a color film may be formed by directly coating a composition for forming a color film on a color film-providable location as in FIG. 1 to FIG. 3, or a method of preparing a color film by coating a composition for forming a color film on a separate substrate or using a known molding method such as casting or extrusion, and then disposing or attaching the color film on a color film-providable location as in FIG. 1 to FIG. 3 may be used. As the coating method, wet coating or dry coating may be used The pigment and the dye capable of being included in the color film may be selected from among those capable of obtaining target colors from a final decoration member, and known in the art, and one, two or more types among pigments and dyes such as red-based, yellow-based, purple-based, blue-based or pink-based may be used. Specifically, dyes such as perinone-based red dyes, anthraquinone-based red dyes, methane-based yellow dyes, anthraquinone-based yellow dyes, anthraquinone-based purple dyes, phthalocyanine-based blue dyes, thioindigo-based pink dyes or isoxindigo-based pink dyes may be used either alone or as a combination. Pigments such as carbon black, copper phthalocyanine (C.I. Pigment Blue 15:3), C.I. Pigment Red 112, Pigment blue or isoindoline yellow may be used either alone or as a combination. As such dyes or pigments, those commercially available may be used, and for example, materials manufactured by Ciba ORACET or Chokwang Paint Ltd. may be used. Types of the dyes or pigments and colors thereof are for illustrative purposes only, and various known dyes or pigments may be used, and more diverse colors may be obtained therefrom.

As the matrix resin included in the color film, materials known as materials of transparent films, primer layers, adhesive layers or coating layers may be used, and the matrix resin is not particularly limited to these materials. For example, various materials such as acryl-based resins, polyethylene terephthalate-based resins, urethane-based resins, linear olefin-based resins, cycloolefin-based resins, epoxy-based resins or triacetylcellulose-based resins may be selected, and copolymers or mixtures of the materials illustrated above may also be used.

When the color film is disposed closer to the location observing a decoration member than the light reflective layer or the light absorbing layer as in, for example, the structures of FIGS. 2A and 2B, and FIGS. 3A to 3C, light transmittance of the colors developed by the color film from the light reflective layer, the light absorbing layer or the laminated structure of the light reflective layer and the light absorbing layer may be 1% or greater, preferably 3% or greater and more preferably 5% or greater. As a result, target colors may be obtained by combining colors developed from the color film and colors developed from the light reflective layer, the light absorbing layer or the laminated structure thereof.

The thickness of the color film is not particularly limited, and those skilled in the art may select and set the thickness as long as it is capable of obtaining target colors. For example, the color film may have a thickness of 500 nm to 1 mm.

According to the embodiments, light absorption occurs in an entering path and a reflection path of light in the light absorbing layer, and by the light reflecting on each of a surface of the light absorbing layer and an interface of the light absorbing layer and the light reflective layer, the two reflected lights go through constructive or destructive interference. In the present specification, the light reflected on the surface of the light absorbing layer may be expressed as surface reflected light, and the light reflected on the interface of the light absorbing layer and the light reflective layer may be expressed as interface reflected light. A mimetic diagram of such a working principle is illustrated in FIG. 4. FIG. 4 illustrates a structure in which a substrate (101) is provided on a light reflective layer (201) side and a color film (401) is provided on the substrate (101) side, however, the structure is not limited to such a structure, and as for the color film (401) and the substrate (101) locations, these may be disposed on other locations as described above.

According to another embodiment of the present application, when the light absorbing layer comprises a pattern, the pattern may have a symmetric structure, an asymmetric structure or a combination thereof.

According to one embodiment, the light absorbing layer may comprise a symmetric-structured pattern. As the symmetric structure, a prism structure, a lenticular lens structure and the like are included.

FIGS. 5A to 5D and FIGS. 6A to 6D illustrate a light absorbing layer (301) having a symmetric-structured pattern. As illustrated in FIG. 5A, a substrate (101) is provided on a light reflective layer (201) side, and as illustrated in FIG. 6A, a substrate (101) is provided on a light absorbing layer (301) side. As illustrated in FIG. 5 and FIG. 6, a pattern provided on one surface of the substrate (101), that is, a surface adjoining the light reflective layer (201) (FIG. 5A) or light absorbing layer (301) of the substrate (101) is obtained. By this pattern structure, the light reflective layer (201) and the light absorbing layer (301) have the same pattern. FIGS. 5A and 6A illustrate a pattern attached to the substrate (101), however, an integrated substrate having a pattern using a method of transforming one surface of the substrate into a pattern form may also be used. In addition, a pattern may be provided on a surface adjoining the light absorbing layer (301) of the light reflective layer (201) whereas the substrate (101) does not have a pattern, or the light reflective layer (201) has a flat surface, and a pattern is provided only on a surface opposite to the surface adjoining the light reflective layer (201) of the light absorbing layer (301).

As illustrated in FIGS. 5A to 5D and 6A to 6D, a color film (401) is provided on the substrate (101) (FIGS. 5A and 6A), between the substrate (101) and the pattern (FIGS. 5B and 6B), on the light absorbing layer (301) (FIGS. 5C and 6C), or between the light absorbing layer (301) and the light reflective layer (201) (FIGS. 5D and 6D). However, the structure is not limited thereto, and the color film (101) may also be provided on two or more of the locations illustrated above. According to another embodiment of the present application, the light absorbing layer may comprise an asymmetric-structured pattern.

In the present specification, the asymmetric-structured pattern means having an asymmetric structure on at least one surface when observing from an upper surface, a side surface or a cross-section. The decoration member may develop dichroism when having such an asymmetric structure. Dichroism means different colors being observed depending on a viewing angle.

Dichroism may be expressed by $\Delta E^*ab = \sqrt{\{(\Delta L)^2 + (\Delta a)^2 + (\Delta b)^2\}}$ relating to the color difference described above, and a viewing angle-dependent color difference being $\Delta E^*ab > 1$ may be defined as having dichroism.

According to one embodiment, the light absorbing layer may have dichroism of $\Delta E^*ab > 1$.

According to one embodiment, the light absorbing layer comprises a pattern in which an upper surface has a cone-shaped protrusion or groove. The cone shape comprises a shape of a circular cone, an oval cone or a polypyramid. Herein, the shape of the bottom surface of the polypyramid comprises a triangle, a square, a star shape having 5 or more protruding points, and the like. The cone shape may have a shape of a protrusion formed on an upper surface of the light absorbing layer, or a shape of a groove formed on an upper surface of the light absorbing layer. The protrusion has a triangular cross-section, and the groove has an inverted triangular cross-section. A lower surface of the light absorbing layer may also have the same shape as the upper surface of the light absorbing layer.

According to one embodiment, an upper surface of the light absorbing layer may comprise a pattern having a cone-shaped protrusion or groove, a pattern having a protrusion in which the highest point has a line shape or a groove in which the lowest point has a line shape, or a pattern having a protrusion or groove with a structure in which the cone-shaped upper surface is cut.

According to one embodiment, the cone-shaped pattern may have an asymmetric structure. For example, when rotating the cone-shaped pattern 360 degrees based on the vertex of the cone and observing from the upper surface, dichroism is difficult to be developed from the pattern when three or more same shapes are present. However, when rotating the cone-shaped pattern 360 degrees based on the vertex of the cone and observing from the upper surface, dichroism may be developed when two or less same shapes are present. FIGS. 7A and 7B illustrate an upper surface of the cone shape, where FIG. 7A illustrates a symmetric-structured cone shape, and FIG. 7B illustrates an asymmetric-structured cone shape.

According to one embodiment, in the pattern having a protrusion in which the highest point has a line shape or a groove in which the lowest point has a line shape, only one same shape may be present when rotating 360 degrees based on the center of gravity of the upper surface and observing from the upper surface.

The symmetric-structured cone shape has a structure in which a cone-shaped bottom surface is a circle or a regular polygon having the same side lengths, and the vertex of the cone is present on a vertical line of the center of gravity of the bottom surface. However, the asymmetric-structured cone shape has a structure in which, when observing from the upper surface, the position of the vertex of the cone is present on a vertical line of a point that is not the center of gravity of the bottom surface, or has a structure in which the bottom surface is an asymmetric-structured polygon or oval. When the bottom surface is an asymmetric-structured polygon, at least one of the sides and the angles of the polygon may be designed to be different from the rest.

For example, as in FIG. 8, the position of the vertex of the cone may be changed. Specifically, when designing the vertex of the cone to be located on a vertical line of the center of gravity (O1) of the bottom surface when observing from the upper surface as in the first drawing of FIG. 8, 4 identical structures may be obtained when rotating 360 degrees based on the vertex of the cone (4-fold symmetry). However, the symmetric structure is broken by designing the vertex of the cone on a position (O2) that is not the center of gravity (O1) of the bottom surface. When employing a length of one side of the bottom surface as x, migration distances of the vertex of the cone as a and b, a height of the cone shape, a length of a line vertically connecting from the vertex of the cone (O1 or O2) to the bottom surface, as h, and an angle formed by the bottom surface and a side surface of the cone as θn, cosine values for Surface 1, Surface 2, Surface 3 and Surface 4 of FIG. 8 may be obtained as follows.

$$\cos(\theta 1) = \frac{\left(\frac{x}{2}\right)}{sqrt\left(h^2 + \left(\frac{x}{2}\right)^2\right)} \quad \cos(\theta 3) = \frac{\left(\frac{x}{2} - a\right)}{sqrt\left(h^2 + \left(\frac{x}{2} - a\right)^2\right)}$$

$$\cos(\theta 2) = \frac{\left(\frac{x}{2}\right)}{sqrt\left(h^2 + \left(\frac{x}{2}\right)^2\right)} \quad \cos(\theta 4) = \frac{\left(\frac{x}{2} - b\right)}{sqrt\left(h^2 + \left(\frac{x}{2} - b\right)^2\right)}$$

Herein, θ1 and θ2 are the same, and therefore, there is no dichroism. However, θ3 and θ4 are different, and |θ3-θ4| means a color difference between two colors (E*ab), and therefore, dichroism may be obtained. Herein, |θ3-θ→1>0. As above, how much the symmetric structure is broken, that is, a degree of asymmetry, may be represented quantitatively using an angle formed by the bottom surface and a side surface of the cone, and the value representing such a degree of asymmetry is proportional to a color difference of dichroism.

According to another embodiment, the light absorbing layer comprises a pattern having a protrusion in which the highest point has a line shape or a groove in which the lowest point has a line shape. The line shape may be a straight-line shape or a curved-line shape, and may comprise both a curved line and a straight line. When rotating the pattern having a line-shaped protrusion or groove 360 degrees based on the center of gravity of an upper surface and observing from the upper surface, dichroism is difficult to be developed when two or more same shapes are present. However, when rotating the pattern having a line-shaped protrusion or groove 360 degrees based on the center of gravity of an upper surface and observing from the upper surface, dichroism may be developed when only one same shape is present. FIG. 9A illustrates an upper surface of a pattern having a line-shaped protrusion that does not exhibit any dichroism, and FIG. 9B illustrates an upper surface of a pattern having a line-shaped protrusion and exhibits dichroism. An X-X' cross-section of FIG. 9A is an isosceles triangle or an equilateral triangle, and a Y-Y' cross-section of FIG. 9B is a triangle having different side lengths.

According to another embodiment, the light absorbing layer comprises a pattern in which an upper surface has a protrusion or groove with a structure in which the cone-shaped upper surface is cut. Such a cross-section of the pattern may have a trapezoidal or inversed trapezoidal shape. In this case, dichroism may also be developed by designing the upper surface, the side surface or the cross-section to have an asymmetric structure.

In addition to the structure illustrated above, various protrusion or groove patterns as in FIG. 10 may be obtained.

According to another embodiment of the present application, the light absorbing layer may comprise two or more regions with different thicknesses.

Through FIG. 31, the light absorbing layer and the light reflective layer are described. In the decoration element of FIG. 31, each layer is laminated in order of a $L_{i-1}$ layer, a $L_i$ layer and a $L_{i+1}$ layer based on a light entering direction, an interface $I_i$ is located between the $L_{i-1}$ layer and the $L_i$ layer, and an interface $I_{i+1}$ is located between the $L_i$ layer and the $L_{i+1}$ layer.

When irradiating light having a specific wavelength in a direction perpendicular to each layer so that thin film interference does not occur, reflectance at the interface $I_i$ may be expressed by the following Mathematical Equation 1.

$$\frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \quad \text{[Mathematical Equation 1]}$$

In Mathematical Equation 1, $n_i(\lambda)$ means a refractive index depending on the wavelength ($\lambda$) of the $i^{th}$ layer, and $k_i(\lambda)$ means an extinction coefficient depending on the wavelength ($\lambda$) of the $i^{th}$ layer. The extinction coefficient is a measure capable of defining how strongly a subject material absorbs light at a specific wavelength, and the definition is as described above.

Using Mathematical Equation 1, when a sum of reflectance for each wavelength at the interface $I_i$ calculated at each wavelength is $R_i$, $R_i$ is as in the following Mathematical Equation 2.

$$R_i = \quad \text{[Mathematical Equation 2]}$$

$$\frac{\sum_{\lambda=380\,nm}^{\lambda=780\,nm} \frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380\,nm}^{\lambda=780\,nm} \Delta\lambda}$$

Examples of the structure according to the embodiment are illustrated in FIG. 11 and FIG. 12. FIG. 11 and FIG. 12 illustrate a structure in which a color film (401) is further provided in a laminated structure of a substrate (101), a light reflective layer (201) and a light absorbing layer (301). FIG. 11 and FIG. 12 illustrate a structure in which the substrate (101) is provided on the light reflective layer (201) side, however, the structure is not limited thereto, and the substrate (101) may also be provided on the light absorbing layer (301) side. According to FIG. 11 and FIG. 12, the light absorbing layer (301) has two or more points with different thicknesses. According to FIG. 11, thicknesses in A region and B region are different in the light absorbing layer (301). According to FIG. 12, thicknesses in C region and D region are different in the light absorbing layer (301). FIG. 11 and FIG. 12 only illustrate an example provided with one color film (401), however, two or more color films (401) may be provided.

According to another embodiment of the present application, the light absorbing layer comprises one or more regions in which an upper surface has an inclined surface with an inclined angle of greater than 0 degrees and less than or equal to 90 degrees, and the light absorbing layer comprises one or more regions having a thickness different from a thickness in any one region having the inclined surface.

Surface properties such as an upper surface slope of the light reflective layer may be the same as an upper surface of the light absorbing layer. For example, by using a deposition method when forming the light absorbing layer, the upper surface of the light absorbing layer may have the same slope as the upper surface of the light reflective layer.

FIG. 13 illustrates a structure of a decoration element having a light absorbing layer in which an upper surface has an inclined surface. The structure is a laminated structure of a color film (401), a substrate (101), a light reflective layer (201) and a light absorbing layer (301), and thickness t1 in E region and thickness t2 in F region are different in the light absorbing layer (301).

FIG. 13 relates to a light absorbing layer having inclined surfaces facing each other, that is, having a structure with a triangle cross-section. In the structure of the pattern having inclined surfaces facing each other as in FIG. 13, a thickness of the light absorbing layer may be different in two surfaces of the triangle structure even when progressing deposition under the same condition. Accordingly, a light absorbing layer having two or more regions with different thicknesses may be formed using just one process. As a result, developed colors may become different depending on the thickness of the light absorbing layer. Herein, the thickness of the light reflective layer does not affect changes in the color when it is a certain thickness or greater.

FIG. 13 illustrates a structure in which the substrate (101) is provided on the light reflective layer (201) side and the color film (401) is provided on the substrate (101) side, however, the structure is not limited thereto, and as described above, the color film (401) and the substrate (101) may also be disposed on other locations. In addition, in FIG. 13, the surface adjoining the light reflective layer (201) of the substrate (101) is a flat surface, however, the surface adjoining the light reflective layer (201) of the substrate (101) may have a pattern having the same slope as an upper surface of the light reflective layer (201). This may cause a difference in the thickness of the light absorbing layer due to a difference in the slope of the pattern of the substrate. However, the present disclosure is not limited thereto, and even when the substrate and the light absorbing layer are prepared to have different slopes using different deposition methods, the dichroism described above may be obtained by having the thickness of the light absorbing layer being different on both sides of the pattern.

According to another embodiment of the present application, the light absorbing layer comprises one or more regions with a gradually changing thickness. FIG. 11 illustrates a structure in which a thickness of the light absorbing layer gradually changes.

According to another embodiment of the present application, the light absorbing layer comprises one or more regions in which an upper surface has an inclined surface with an inclined angle of greater than 0 degrees and less than or equal to 90 degrees, and at least one region having the inclined surface has a structure in which a thickness of the light absorbing layer gradually changes. FIG. 14 illustrates a structure of a light absorbing layer comprising a region in which an upper surface has an inclined surface. In FIG. 14, both G region and H region have a structure in which an upper surface of the light absorbing layer has an inclined surface, and a thickness of the light absorbing layer gradually changes.

According to one embodiment, the light absorbing layer comprises a first region having a first inclined surface with an inclined angle in a range of 1 degrees to 90 degrees, and may further comprise a second region in which an upper surface has an inclined surface with a different slope direction or a different inclined angle from the first inclined surface, or an upper surface is horizontal. Herein, thicknesses in the first region and the second region may be different from each other in the light absorbing layer.

According to another embodiment, the light absorbing layer comprises a first region having a first inclined surface with an inclined angle in a range of 1 degrees to 90 degrees, and may further comprise two or more regions in which an upper surface has an inclined surface with a different slope direction or a different inclined angle from the first inclined surface, or an upper surface is horizontal. Herein, thicknesses in the first region and the two or more regions may all be different from each other in the light absorbing layer.

The light absorbing layer may implement various colors depending on a refractive index (n), an extinction coefficient (k) and a thickness (t). FIG. 15 shows reflectance by a wavelength depending on a thickness of the light absorbing layer, and FIG. 16 shows colors obtained therefrom. Specifically, FIG. 15 is a reflectance simulation graph depending on a CuO deposition thickness of CuO/Cu, and is a material prepared while varying a CuO thickness from 10 nm to 60 nm under the same deposition condition.

FIG. 17 shows a simulation result indicating that different colors are observed depending on a viewing angle. FIG. 17 is a simulation result of CuON/Al. In FIG. 17, the thickness of the light absorbing layer increases from 10 nm to 100 nm by 10 nm, and an incidence angle is adjusted from 0 degrees to 60 degrees at a 15 degrees interval. Through such a simulation result, it is seen that, in the structure according to an embodiment of the present application, various colors may be obtained by adjusting a thickness of the light absorbing layer and an inclined angle of the upper surface. By being provided with a color film in addition thereto, more diverse colors may be obtained.

The light reflective layer is not particularly limited as long as it is a material capable of reflecting light, however, light reflectance may be determined depending on the material, and for example, colors are readily expressed at 50% or greater. Light reflectance may be measured using an ellipsometer.

The light absorbing layer preferably has a refractive index (n) of 0 to 8 at 400 nm, and the refractive index may be from 0 to 7, may be from 0.01 to 3, and may be from 2 to 2.5. The refractive index (n) may be calculated by $\sin\theta 1/\sin\theta 2$ ($\theta 1$ is an angle of light incident on a surface of the light absorbing layer, and $\theta 2$ is a refraction angle of light inside the light absorbing layer).

The light absorbing layer preferably has a refractive index (n) of 0 to 8 at 380 nm to 780 nm, and the refractive index may be from 0 to 7, may be from 0.01 to 3, and may be from 2 to 2.5.

The light absorbing layer may have an extinction coefficient (k) of greater than 0 and less than or equal to 4 at 400 nm, and the extinction coefficient (k) is preferably from 0.01 to 4, may be from 0.01 to 3.5, may be from 0.01 to 3, and may be from 0.1 to 1. The extinction coefficient (k) is $-\lambda/4\pi\mathrm{I}$ (dI/dx) (herein, a value multiplying $\lambda/4\pi$ with dI/I, a reduced fraction of light intensity per a path unit length (dx), for example 1 m, in the light absorbing layer, and herein, $\lambda$ is a wavelength of light).

The light absorbing layer may have an extinction coefficient (k) of greater than 0 and less than or equal to 4 at 380 nm to 780 nm, and the extinction coefficient (k) is preferably from 0.01 to 4, may be from 0.01 to 3.5, may be from 0.01 to 3, and may be from 0.1 to 1.

The extinction coefficient (k) is in the above-mentioned range at 400 nm, preferably in the whole visible wavelength region of 380 nm to 780 nm, and therefore, a role of the light absorbing layer may be performed in the visible range.

For example, using a method of absorbing light by adding a dye to a resin, and using a material having an extinction coefficient as described above lead to different light absorption spectra. When absorbing light by adding a dye to a resin, an absorption wavelength band is fixed, and only a phenomenon of varying an absorption amount depending on the changes in the coating thickness occurs. In addition, in order to obtain a target light absorption amount, changes in the thickness of at least a few micrometers or more are required to adjust the light absorption amount. On the other hand, in materials having an extinction coefficient, a wavelength band absorbing light changes even when the thickness changes by a several to tens of nanometer scale.

According to one embodiment, the light reflective layer may be a metal layer, a metal oxide layer, a metal nitride layer, a metal oxynitride layer, a carbon or carbon composite layer, or an inorganic material layer. The light reflective layer may be formed in a single layer, or may be formed in a multilayer of two or more layers.

As one example, the light reflective layer may be a single layer or a multilayer comprising one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag); oxides thereof; nitrides thereof; oxynitrides thereof; and one, two or more types of materials selected from the group consisting of carbon and carbon composites. For example, the light reflective layer may comprise two or more alloys selected from among the above-mentioned materials, or oxides, nitrides or oxynitrides thereof. More specifically, molybdenum, aluminum or copper may be included. According to another embodiment, the light reflective layer may allow highly resistant reflective layer by being prepared using an ink comprising carbon or carbon composites. Carbon black, CNT and the like may be included as the carbon or carbon composites. The ink comprising carbon or carbon composites may comprise above-described materials, or oxides, nitrides or oxynitrides thereof, and for example, one, two or more types of oxides selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag) may be included. A curing process may be further carried out after printing the ink comprising carbon or carbon composites.

When the light reflective layer comprises two or more types of materials, the two or more types of materials may be formed using one process, for example, a method of deposition or printing, however, a method of first forming a layer using one or more types of materials, and then additionally forming a layer thereon using one or more types of materials may be used. For example, a light reflective layer may be formed by forming a layer through depositing indium or tin, then printing an ink comprising carbon, and then curing the result. The ink may further comprise oxides such as titanium oxides or silicon oxides.

According to one embodiment, the light absorbing layer may be a single layer, or a multilayer of two or more layers. The light absorbing layer may be formed with materials having an extinction coefficient (k) at 380 nm to 780 nm, that is, materials having an extinction coefficient of greater than 0 and less than or equal to 4, preferably 0.01 to 4. For example, the light absorbing layer may comprise one, two or more selected from the group consisting of metals, metalloids, and oxides, nitrides, oxynitrides and carbides of metals or metalloids. The oxides, nitrides, oxynitrides or carbides of metals or metalloids may be formed under a deposition condition and the like set by those skilled in the art. The light absorbing layer may also comprise the same metals, metalloids, alloys or oxynitrides of two or more types as the light reflective layer.

For example, the light absorbing layer may be a single layer or a multilayer comprising one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag); oxides thereof; nitrides thereof; oxynitrides thereof; and one, two or more types of materials selected from the group consisting of carbon and carbon composites. As specific examples, the light absorbing layer comprises one, two or more types selected from among copper oxides, copper nitrides, copper oxynitrides, aluminum oxides, aluminum nitrides, aluminum oxynitrides and molybdenum titanium oxynitrides.

According to one embodiment, the light absorbing layer comprises silicon (Si) or germanium (Ge).

The light absorbing layer formed with silicon (Si) or germanium (Ge) may have a refractive index (n) of 0 to 8, or 0 to 7 at 400 nm, and may have an extinction coefficient (k) of greater than 0 and less than or equal to 4, preferably 0.01 to 4, and the extinction coefficient (k) may be from 0.01 to 3 or from 0.01 to 1.

According to another embodiment, the light absorbing layer comprises one, two or more types selected from among copper oxides, copper nitrides, copper oxynitrides, aluminum oxides, aluminum nitrides, aluminum oxynitrides and molybdenum titanium oxynitrides. In this case, the light absorbing layer may have a refractive index (n) of 1 to 3, for example, 2 to 2.5 at 400 nm, and an extinction coefficient (k) of greater than 0 and less than or equal to 4, preferably 0.01 to 2.5, preferably 0.2 to 2.5 and more preferably 0.2 to 0.6.

According to one embodiment, the light absorbing layer is AlOxNy (x>0, y>0).

According to another embodiment, the light absorbing layer may be AlOxNy (0≤x≤1.5, 0≤y≤1).

According to another embodiment, the light absorbing layer is AlOxNy (x>0, y>0), and with respect to the total number of atoms 100%, the number of each atom satisfies the following equation.

$$1 < \frac{(Al)at \times 3}{(O)at \times 2 + (N)at \times 3} < 2$$

According to one embodiment, the light absorbing layer may be formed with materials having an extinction coefficient (k) at 400 nm, preferably at 380 to 780 nm, and for example, the light absorbing layer/light reflective layer may be formed with materials such as CuO/Cu, CuON/Cu, CuON/Al, AlON/Al, AlN/AL/AlON/Cu or AlN/Cu.

According to one embodiment, the thickness of the light reflective layer may be determined depending on target color in a final structure, and for example, may be 1 nm or greater, preferably 25 nm or greater, for example, 50 nm or greater, and preferably 70 nm or greater.

According to one embodiment, the thickness of the light absorbing layer may be from 5 nm to 500 nm, for example, from 30 nm to 500 nm.

According to one embodiment, a difference in the thickness by the region of the light absorbing layer is from 2 nm to 200 nm, and may be determined depending on a target color difference.

According to one embodiment, a substrate provided on a lower surface of the light reflective layer or an upper surface of the light absorbing layer may be further included. Surface properties such as an upper surface slope of the substrate may be the same as upper surfaces of the light reflective layer and the light absorbing layer. By forming the light reflective layer and the light absorbing layer using a deposition method, the substrate, the light reflective layer and the light absorbing layer may have an inclined surface with the same angle. For example, the structure as above may be obtained by forming an inclined surface or a three-dimensional structure on an upper surface of a substrate, and depositing a light reflective layer and a light absorbing layer thereon in this order, or depositing a light absorbing layer and a light reflective layer in this order.

According to one embodiment, forming an inclined surface or a three-dimensional structure on the substrate surface may be carried out using a method of forming a pattern on an ultraviolet curable resin and curing the result using ultraviolet rays, or processing with laser. According to one embodiment, the decoration element may be a deco film or a case of a mobile device. The decoration element may further comprise a gluing layer as necessary.

Materials of the substrate are not particularly limited, and ultraviolet curable resins known in the art may be used when forming an inclined surface or a three-dimensional structure using methods as above.

On the light absorbing layer, a protective layer may be further provided.

According to one embodiment, an adhesive layer may be further provided on an opposite surface of the substrate provided with the light absorbing layer or the light reflective layer. This adhesive layer may be an optically clear adhesive (OCA) layer. As necessary, a peel-off layer (release liner) may be further provided on the adhesive layer for protection.

Deposition such as a sputtering method has been described as an example of forming the light reflective layer and the light absorbing layer in the present specification, however, various methods of preparing a thin film may be used as long as constitutions and properties according to embodiments described in the present specification are obtained. For example, a vapor deposition method, a chemical vapor deposition (CVD) method, wet coating and the like may be used.

Hereinafter, the present disclosure will be described in more detail with reference to examples. However, the following examples are for illustrative purposes only, and are not to limit the scope of the present disclosure.

Examples 1 and 2

A blue color film was formed on a PET substrate by a wet coating process using a blue pigment-dispersed solution. In order to identify properties of the color film formed herein, values measuring light transmittance and light reflectance for the structures illustrated in FIG. 18 and FIG. 19 are shown in FIG. 18 and FIG. 19. An AlON (Al 58 at %, O 3.5 at %, N 38.5 at %) light absorbing layer was formed thereon using a reactive sputtering method by adding nitrogen. In Example 1, the light absorbing layer was formed to a thickness of approximately 40 nm, and in Example 2, the light absorbing layer was formed to a thickness of approximately 80 nm. On the light absorbing layer, Al was deposited using a sputtering method to form a light reflective layer (Al, thickness 120 nm). As a reference, n and k values of the aluminum oxynitride are as shown in FIG. 20.

Comparative Examples 1 and 2

Preparation was performed in the same manner as in Example 1 except that the color film was not laminated. Colors of the decoration films prepared in Comparative Examples 1 and 2 and Examples 1 and 2 are shown in FIG. 21. The colors were calculated using reflectance (SCI, Specular Component Included) in a visible region measured using a CM-2600d device manufactured by Konica Minolta, Inc. The specific color conversion condition was based on a viewer angle 10° observer in a D65 light source.

According to FIG. 21, it was identified that a color difference $\Delta E*ab$ was greater than 1 by the color film lamination when comparing Example 1 with Comparative Example 1, and Example 2 with Comparative Example 2, and it was seen that target colors were able to be manufactured by the color film addition even when the light absorbing layers have the same composition or thickness.

Comparative Example 3

After forming a light reflective layer (Al, thickness 120 nm) on glass by depositing Al using a sputtering method, an AlON (Al 58 at %, O 3.5 at %, N 38.5 at %) light absorbing layer was formed thereon using a reactive sputtering method by adding nitrogen. In Comparative Example 3, the light absorbing layer was prepared to have 10 types of thicknesses from 10 nm to 100 nm at an interval of 10 nm. Colors of the decoration elements obtained therefrom were calculated as in Example 1 through the air, and the results are shown in FIG. 22. The CIE color coordinate L*,a*,b* values at each of the thicknesses were 10 nm (95.32,−0.51,2.23), 20 nm (91.26,−1.30,11.00), 30 nm (81.91,−0.53,31.90), 40 nm (64.91,10.37,46.92), 50 nm (47.30,21.19,3.89), 60 nm (47.80,5.22,−21.29), 70 nm (58.83,−5.56,−17.77), 80 nm (67.80,−6.78,−10.08), 90 nm (73.44,−6.36,−2.44) and 100 nm (76.52,−6.43,6.39).

Comparative Example 4

Preparation was performed in the same manner as in Comparative Example 3 except that a light reflective layer (Al, thickness 120 nm) was formed after forming an AlON (Al 58 at %, O 3.5 at %, N 38.5 at %) light absorbing layer on glass. Colors of the decoration elements obtained therefrom were calculated as in Example 1 through the glass, and the results are shown in FIG. 22.

Comparative Example 5

Preparation was performed in the same manner as in Comparative Example 3 except that a light absorbing layer was prepared to have 10 types of thicknesses from 120 nm to 300 nm at an interval of 20 nm. Colors of the decoration elements obtained therefrom were calculated as in Example 1 through the air, and the results are shown in FIG. 22.

Comparative Example 6

Preparation was performed in the same manner as in Comparative Example 4 except that a light absorbing layer was prepared to have 10 types of thicknesses from 120 nm to 300 nm at an interval of 20 nm. Colors of the decoration elements obtained therefrom were calculated as in Example 1 through the glass, and the results are shown in FIG. 22.

CIE Lab coordinate values of the decoration elements according to Comparative Examples 3 to 6 at each of the thicknesses are shown in the following Table 1 and Table 2.

TABLE 1

| Thickness | Comparative Example 3 | | | Comparative Example 4 | | |
|---|---|---|---|---|---|---|
| | L* | a* | b* | L* | a* | b* |
| 10 nm | 95.32 | −0.51 | 2.23 | 93.75 | −0.62 | 2.41 |
| 20 nm | 91.26 | −1.30 | 11.00 | 89.58 | −1.02 | 9.97 |
| 30 nm | 81.91 | −0.53 | 31.90 | 81.83 | −0.07 | 22.16 |
| 40 nm | 64.91 | 10.37 | 46.92 | 70.82 | 4.20 | 29.76 |
| 50 nm | 47.30 | 21.19 | 3.89 | 60.21 | 8.43 | 20.07 |
| 60 nm | 47.80 | 5.22 | −21.29 | 55.31 | 6.76 | 3.45 |
| 70 nm | 58.83 | −5.56 | −17.77 | 56.87 | 1.61 | −4.38 |
| 80 nm | 67.80 | −6.78 | −10.08 | 61.08 | −2.14 | −4.22 |
| 90 nm | 73.44 | −6.36 | −2.44 | 65.06 | −4.21 | 0.25 |
| 100 nm | 76.52 | −6.43 | 6.39 | 67.75 | −5.57 | 8.03 |

TABLE 2

| Thickness | Comparative Example 5 | | | Comparative Example 6 | | |
|---|---|---|---|---|---|---|
| | L* | a* | b* | L* | a* | b* |
| 120 nm | 76.52 | −7.13 | 36.40 | 67.92 | −5.78 | 35.59 |
| 140 nm | 66.99 | 8.55 | 71.23 | 59.37 | 7.73 | 71.09 |
| 160 nm | 45.82 | 49.15 | 4.52 | 41.75 | 36.42 | 24.42 |
| 180 nm | 31.89 | 32.75 | −44.49 | 27.40 | 34.36 | −26.04 |
| 200 nm | 47.25 | −33.13 | −19.26 | 35.72 | −19.33 | −14.12 |
| 220 nm | 58.98 | −30.12 | 17.38 | 45.73 | −27.53 | 20.42 |
| 240 nm | 61.47 | −9.82 | 38.84 | 48.29 | −10.29 | 48.92 |
| 260 nm | 56.47 | 17.84 | 23.73 | 43.52 | 16.62 | 35.67 |
| 280 nm | 47.03 | 38.26 | −4.63 | 33.53 | 39.75 | 3.20 |
| 300 nm | 40.53 | 24.58 | −18.11 | 24.65 | 34.02 | −15.56 |

Examples 3 to 6

Examples 3 and 5 were performed in the same manner as in Comparative Examples 3 and 5 except that a red color film was formed on the light absorbing layer through a wet coating process using a red pigment-dispersed solution. Examples 4 and 6 were performed in the same manner as in Comparative Examples 4 and 6 except that, before forming the light absorbing layer, a red color film was formed on glass through a wet coating process using a red pigment-dispersed solution. In order to identify properties of the color film formed herein, values measuring light transmittance and light reflectance for the structures illustrated in FIG. 18 and FIG. 19 are shown in FIG. 18 and FIG. 19. Colors of the decoration elements of Examples 3 and 5 recognized through the air, and colors of the decoration elements of Examples 4 and 6 recognized through the glass were calculated as in Example 1, and the results are shown in FIG. 23.

CIE Lab coordinate values of the decoration elements according to Examples 3 to 6 at each of the thicknesses are shown in the following Table 3 and Table 4.

TABLE 3

| Thickness | Example 3 | | | Example 4 | | |
|---|---|---|---|---|---|---|
| | L* | a* | b* | L* | a* | b* |
| 10 nm | 76.99 | −0.37 | 1.59 | 75.87 | −0.44 | 1.71 |
| 20 nm | 74.27 | −0.92 | 7.72 | 73.08 | −0.72 | 6.97 |
| 30 nm | 67.73 | −0.36 | 20.95 | 67.68 | −0.05 | 14.79 |
| 40 nm | 56.62 | 6.56 | 25.45 | 60.41 | 2.75 | 18.20 |
| 50 nm | 46.68 | 11.56 | 2.01 | 54.07 | 5.20 | 11.57 |
| 60 nm | 46.76 | 2.77 | −12.13 | 50.92 | 3.95 | 1.97 |
| 70 nm | 53.24 | −3.34 | −11.20 | 52.06 | 0.96 | −2.63 |
| 80 nm | 59.02 | −4.40 | −6.69 | 54.74 | −1.33 | −2.65 |
| 90 nm | 62.78 | −4.28 | −1.65 | 57.26 | −2.69 | 0.16 |
| 100 nm | 64.72 | −4.39 | 4.34 | 58.84 | −3.62 | 5.17 |

TABLE 4

| Thickness | Example 5 | | | Example 6 | | |
|---|---|---|---|---|---|---|
| | L* | a* | b* | L* | a* | b* |
| 120 nm | 63.94 | −4.75 | 22.77 | 58.32 | −3.66 | 20.71 |
| 140 nm | 57.85 | 5.47 | 35.33 | 53.15 | 4.65 | 30.66 |
| 160 nm | 45.60 | 26.96 | 2.24 | 43.60 | 18.49 | 9.85 |
| 180 nm | 39.51 | 13.59 | −21.94 | 37.93 | 12.72 | −10.58 |
| 200 nm | 46.66 | −16.40 | −10.91 | 41.15 | −7.74 | −6.53 |
| 220 nm | 53.09 | −17.47 | 9.91 | 45.69 | −13.32 | 9.36 |
| 240 nm | 54.85 | −6.01 | 21.17 | 47.21 | −5.41 | 19.66 |
| 260 nm | 51.94 | 10.82 | 12.98 | 44.81 | 8.59 | 14.21 |
| 280 nm | 46.59 | 21.56 | −2.51 | 40.22 | 18.00 | 1.27 |
| 300 nm | 43.14 | 12.33 | −9.43 | 36.86 | 12.02 | −5.60 |

Examples 7 to 10

Examples 7 to 10 were performed in the same manner as in Comparative Examples 3 and 6 except that a blue color film was used instead of the red color film. Herein, the blue color film is the same as in Example 1. Colors of the decoration elements of Examples 7 and 9 recognized through the air, and colors of the decoration elements of Examples 8 and 10 recognized through the glass were calculated as in Example 1, and the results are shown in FIG. 24.

CIE Lab coordinate values of the decoration elements according to Examples 7 to 10 at each of the thicknesses are shown in the following Table 5 and Table 6.

TABLE 5

| Thickness | Example 7 | | | Example 8 | | |
|---|---|---|---|---|---|---|
| | L* | a* | b* | L* | a* | b* |
| 10 nm | 59.65 | −0.26 | 1.15 | 58.84 | −0.32 | 1.23 |
| 20 nm | 58.33 | −0.67 | 5.63 | 57.46 | −0.53 | 5.07 |
| 30 nm | 54.65 | −0.27 | 15.23 | 54.61 | −0.04 | 10.83 |
| 40 nm | 47.52 | 4.86 | 18.06 | 50.34 | 2.06 | 13.35 |
| 50 nm | 40.68 | 8.30 | 1.43 | 46.06 | 3.87 | 8.43 |
| 60 nm | 41.38 | 2.05 | −9.11 | 44.48 | 2.99 | 1.48 |
| 70 nm | 46.86 | −2.61 | −8.86 | 45.94 | 0.75 | −2.05 |
| 80 nm | 51.95 | −3.56 | −5.45 | 48.51 | −1.06 | −2.12 |
| 90 nm | 55.69 | −3.55 | −1.38 | 51.13 | −2.20 | 0.13 |
| 100 nm | 58.18 | −3.73 | 3.68 | 53.21 | −3.04 | 4.32 |

TABLE 6

| Thickness | Example 9 | | | Example 10 | | |
|---|---|---|---|---|---|---|
| | L* | a* | b* | L* | a* | b* |
| 120 nm | 50.37 | −3.30 | 15.32 | 46.50 | −2.48 | 13.51 |
| 140 nm | 46.59 | 3.79 | 22.75 | 43.38 | 3.14 | 19.18 |
| 160 nm | 38.94 | 18.33 | 1.48 | 37.63 | 12.29 | 6.25 |
| 180 nm | 35.48 | 9.07 | −15.23 | 34.45 | 8.35 | −7.05 |
| 200 nm | 40.66 | −11.51 | −7.91 | 36.83 | −5.22 | −4.52 |
| 220 nm | 46.12 | −13.18 | 7.44 | 40.59 | −9.64 | 6.72 |
| 240 nm | 48.12 | −4.72 | 16.19 | 42.21 | −4.09 | 14.36 |
| 260 nm | 46.28 | 8.60 | 10.09 | 40.73 | 6.60 | 10.54 |
| 280 nm | 42.57 | 17.14 | −1.98 | 37.65 | 13.79 | 0.95 |
| 300 nm | 40.37 | 9.82 | −7.56 | 35.51 | 9.19 | −4.29 |

Examples 11 to 14

Examples 11 to 14 were performed in the same manner as in Comparative Examples 3 and 6 except that a gold color film was used instead of the red color film. In order to identify properties of the color film formed herein, values measuring light transmittance and light reflectance for the structures illustrated in FIG. 18 and FIG. 19 are shown in FIG. 18 and FIG. 19. Colors of the decoration elements of Examples 11 and 13 recognized through the air, and colors of the decoration elements of Examples 12 and 14 recognized through the glass were calculated as in Example 1, and the results are shown in FIG. 25.

CIE Lab coordinate values of the decoration elements according to Examples 11 to 14 at each of the thicknesses are shown in the following Table 7 and Table 8.

TABLE 7

| Thickness | Example 11 | | | Example 12 | | |
|---|---|---|---|---|---|---|
| | L* | a* | b* | L* | a* | b* |
| 10 nm | 71.49 | −0.34 | 1.46 | 70.47 | −0.41 | 1.57 |
| 20 nm | 69.02 | −0.84 | 7.08 | 67.93 | −0.66 | 6.38 |
| 30 nm | 63.14 | −0.33 | 19.08 | 63.09 | −0.04 | 13.49 |
| 40 nm | 53.17 | 5.99 | 22.95 | 56.64 | 2.52 | 16.57 |
| 50 nm | 44.09 | 10.28 | 1.78 | 50.68 | 4.68 | 10.33 |
| 60 nm | 44.35 | 2.47 | −10.86 | 48.06 | 3.55 | 1.77 |
| 70 nm | 50.11 | −2.99 | −10.09 | 49.06 | 0.86 | −2.35 |
| 80 nm | 55.49 | −3.98 | −6.07 | 51.63 | −1.19 | −2.38 |
| 90 nm | 58.76 | −3.85 | −1.49 | 53.80 | −2.40 | 0.14 |
| 100 nm | 71.49 | −0.34 | 1.46 | 55.37 | −3.24 | 4.61 |

TABLE 8

| Thickness | Example 13 | | | Example 14 | | |
|---|---|---|---|---|---|---|
| | L* | a* | b* | L* | a* | b* |
| 120 nm | 59.58 | −4.31 | 20.49 | 54.50 | −3.30 | 18.49 |
| 140 nm | 54.05 | 4.95 | 31.34 | 49.81 | 4.18 | 26.98 |
| 160 nm | 43.13 | 24.10 | 1.99 | 41.36 | 16.42 | 8.62 |
| 180 nm | 37.78 | 12.03 | −19.66 | 36.39 | 11.21 | −9.36 |
| 200 nm | 44.06 | −14.45 | −9.73 | 39.22 | −6.72 | −5.73 |
| 220 nm | 50.01 | −15.67 | 8.87 | 43.39 | −11.76 | 8.23 |
| 240 nm | 51.56 | −5.40 | 18.78 | 44.74 | −4.78 | 17.07 |
| 260 nm | 49.12 | 9.70 | 11.51 | 42.80 | 7.57 | 12.30 |
| 280 nm | 44.38 | 18.93 | −2.19 | 38.88 | 15.45 | 1.08 |
| 300 nm | 41.57 | 10.66 | −8.19 | 36.24 | 10.10 | −4.71 |

Examples 15 to 18

Examples 15 to 18 were performed in the same manner as in Comparative Examples 3 and 6 except that an orchid color film was used instead of the red color film. In order to identify properties of the color film formed herein, values measuring light transmittance and light reflectance for the structures illustrated in FIG. 18 and FIG. 19 are shown in FIG. 18 and FIG. 19. Colors of the decoration elements of Examples 15 and 17 recognized through the air, and colors of the decoration elements of Examples 16 and 18 recognized through the glass were calculated as in Example 1, and the results are shown in FIG. 26.

According to FIG. 22 to FIG. 26, it was identified that a color difference ΔE*ab was greater than 1 by the color film lamination in the examples using the color film compared to the comparative examples, and it was seen that target colors were able to be manufactured by adding a color film in various colors even when the light absorbing layers have the same composition or thickness.

CIE Lab coordinate values of the decoration elements according to Examples 15 to 18 at each of the thicknesses are shown in the following Table 9 and Table 10.

TABLE 9

| Thickness | Example 15 | | | Example 16 | | |
|---|---|---|---|---|---|---|
| | L* | a* | b* | L* | a* | b* |
| 10 nm | 62.81 | −0.30 | 1.31 | 61.89 | −0.36 | 1.40 |
| 20 nm | 60.79 | −0.76 | 6.37 | 59.80 | −0.59 | 5.74 |
| 30 nm | 55.79 | −0.30 | 17.26 | 55.74 | −0.04 | 12.21 |
| 40 nm | 46.72 | 5.41 | 20.70 | 49.84 | 2.27 | 14.96 |
| 50 nm | 38.78 | 9.39 | 1.63 | 44.81 | 4.27 | 9.44 |
| 60 nm | 39.02 | 2.28 | −10.02 | 42.45 | 3.27 | 1.63 |
| 70 nm | 44.38 | −2.76 | −9.29 | 43.41 | 0.79 | −2.17 |
| 80 nm | 49.16 | −3.64 | −5.56 | 45.62 | −1.09 | −2.18 |
| 90 nm | 52.35 | −3.56 | −1.38 | 47.76 | −2.22 | 0.13 |
| 100 nm | 54.10 | −3.68 | 3.64 | 49.18 | −3.02 | 4.30 |

TABLE 10

| Thickness | Example 17 | | | Example 18 | | |
|---|---|---|---|---|---|---|
| | L* | a* | b* | L* | a* | b* |
| 120 nm | 52.15 | −3.85 | 18.28 | 47.61 | −2.95 | 16.46 |
| 140 nm | 47.32 | 4.44 | 28.08 | 43.52 | 3.75 | 24.15 |
| 160 nm | 37.69 | 21.77 | 1.79 | 36.09 | 14.82 | 7.78 |
| 180 nm | 32.84 | 10.84 | −17.72 | 31.59 | 10.09 | −8.43 |
| 200 nm | 38.76 | −13.21 | −8.89 | 34.33 | −6.15 | −5.24 |
| 220 nm | 44.25 | −14.45 | 8.18 | 38.14 | −10.86 | 7.61 |
| 240 nm | 45.72 | −4.97 | 17.32 | 39.44 | −4.41 | 15.79 |

TABLE 10-continued

|  | Example 17 | | | Example 18 | | |
| --- | --- | --- | --- | --- | --- | --- |
| Thickness | L* | a* | b* | L* | a* | b* |
| 260 nm | 43.32 | 8.89 | 10.57 | 37.51 | 6.95 | 11.32 |
| 280 nm | 39.01 | 17.60 | −2.04 | 33.88 | 14.44 | 1.01 |
| 300 nm | 36.25 | 10.03 | −7.70 | 31.21 | 9.59 | −4.47 |

Examples 19 to 21

Decoration elements comprising a red color film were prepared as in Example 3 except that glass having a dichroic pattern as in FIG. 27 was used instead of flat glass. Colors of the decoration elements prepared in these examples recognized through the air were calculated as in Example 1, and the results are shown in FIG. 28. Herein, the thickness of the side seen from a low angle of the light absorbing layer and the thickness thereof seen from a high angle were 30 nm and 10 nm, respectively, in Example 19, 80 nm and 30 nm, respectively, in Example 20, and 140 nm and 50 nm, respectively, in Example 21.

Examples 22 to 24

Decoration elements comprising a blue color film were prepared as in Example 7 except that glass having a dichroic pattern as in FIG. 27 was used instead of flat glass. Colors of the decoration elements prepared in these examples recognized through the air were calculated as in Example 1, and the results are shown in FIG. 28. Herein, the thickness of the side seen from a low angle of the light absorbing layer and the thickness thereof seen from a high angle were 30 nm and 10 nm, respectively, in Example 22, 80 nm and 30 nm, respectively, in Example 23, and 140 nm and 50 nm, respectively, in Example 24.

Examples 25 to 27

Decoration elements comprising a gold color film were prepared as in Example 11 except that glass having a dichroic pattern as in FIG. 27 was used instead of flat glass. Colors of the decoration elements prepared in these examples recognized through the air were calculated as in Example 1, and the results are shown in FIG. 28. Herein, the thickness of the side seen from a low angle of the light absorbing layer and the thickness thereof seen from a high angle were 30 nm and 10 nm, respectively, in Example 25, 80 nm and 30 nm, respectively, in Example 26, and 140 nm and 50 nm, respectively, in Example 27.

Comparative Examples 7 to 9

Decoration elements were prepared as in Examples 19 to 21 except that a color film was not added, and colors of the decoration elements recognized through the air were calculated as in Example 1, and the results are shown in FIG. 28. According to FIG. 28, it was identified that a color difference ΔE*ab was greater than 1 by the color film lamination, and it was seen that target colors were able to be manufactured by adding a color film in various colors even when the light absorbing layers have the same composition or thickness.

The results of FIG. 28 are shown in the following Table 11 to Table 13.

TABLE 11

|  | Dichroic Decoration Element 1 | | | | | |
| --- | --- | --- | --- | --- | --- | --- |
|  | Left View | | | Right View | | |
|  | L* | a* | b* | L* | a* | b* |
| No Color film | 81.91 | −0.53 | 31.90 | 95.32 | −0.51 | 2.23 |
| Add Red Color Film | 67.73 | −0.36 | 20.95 | 76.99 | −0.37 | 1.59 |
| Add Blue Color Film | 54.65 | −0.27 | 15.23 | 59.65 | −0.26 | 1.15 |
| Add Gold Color Film | 63.14 | −0.33 | 19.08 | 71.49 | −0.34 | 1.46 |

TABLE 12

|  | Dichroic Decoration Element 2 | | | | | |
| --- | --- | --- | --- | --- | --- | --- |
|  | Left View | | | Right View | | |
|  | L* | a* | b* | L* | a* | b* |
| No Color Film | 67.80 | −6.78 | −10.08 | 81.91 | −0.53 | 31.90 |
| Add Red Color Film | 59.02 | −4.40 | −6.69 | 67.73 | −0.36 | 20.95 |
| Add Blue Color Film | 51.95 | −3.56 | −5.45 | 54.65 | −0.27 | 15.23 |
| Add Gold Color Film | 55.49 | −3.98 | −6.07 | 63.14 | −0.33 | 19.08 |

TABLE 13

|  | Dichroic Decoration Element 3 | | | | | |
| --- | --- | --- | --- | --- | --- | --- |
|  | Left View | | | Right View | | |
|  | L* | a* | b* | L* | a* | b* |
| No Color Film | 66.99 | 8.55 | 71.23 | 47.30 | 21.19 | 3.89 |
| Add Red Color Film | 57.85 | 5.47 | 35.33 | 46.68 | 11.56 | 2.01 |
| Add Blue Color Film | 46.59 | 3.79 | 22.75 | 40.68 | 8.30 | 1.43 |
| Add Gold Color Film | 54.05 | 4.95 | 31.34 | 44.09 | 10.28 | 1.78 |

Examples 28 to 30

Decoration elements comprising a red color film were prepared as in Example 4 except that glass having a dichroic pattern as in FIG. 27 was used instead of flat glass. Colors of the decoration elements prepared in these examples recognized through the glass were calculated as in Example 1, and the results are shown in FIG. 29. Herein, the thickness of the side seen from a low angle of the light absorbing layer and the thickness thereof seen from a high angle were 30 nm and 10 nm, respectively, in Example 28, 80 nm and 30 nm, respectively, in Example 29, and 140 nm and 50 nm, respectively, in Example 30.

Examples 31 to 33

Decoration elements comprising a blue color film were prepared as in Example 8 except that glass having a dichroic pattern as in FIG. 27 was used instead of flat glass. Colors of the decoration elements prepared in these examples recognized through the glass were calculated as in Example 1, and the results are shown in FIG. 29. Herein, the thickness of the side seen from a low angle of the light absorbing layer and the thickness thereof seen from a high angle were 30 nm and 10 nm, respectively, in Example 31, 80 nm and 30 nm, respectively, in Example 32, and 140 nm and 50 nm, respectively, in Example 33.

Example 34 to 36

Decoration elements comprising a gold color film were prepared as in Example 12 except that glass having a dichroic pattern as in FIG. 27 was used instead of flat glass. Colors of the decoration elements prepared in these examples recognized through the glass were calculated as in Example 1, and the results are shown in FIG. 29. Herein, the thickness of the side seen from a low angle of the light absorbing layer and the thickness thereof seen from a high angle were 30 nm and 10 nm, respectively, in Example 34, 80 nm and 30 nm, respectively, in Example 35, and 140 nm and 50 nm, respectively, in Example 36.

Comparative Example 10 to 12

Decoration elements were prepared as in Examples 28 to 30 except that a color film was not added, and colors of the decoration elements recognized through the air were calculated as in Example 1, and the results are shown in FIG. 29. According to FIG. 29, it was identified that a color difference $\Delta E^*ab$ was greater than 1 by the color film lamination, and it was seen that target colors were able to be manufactured by adding a color film in various colors even when the light absorbing layers have the same composition or thickness.

The results of FIG. 29 are shown in the following Table 14 to Table 16.

TABLE 14

| | Dichroic Decoration Element 4 | | | | | |
|---|---|---|---|---|---|---|
| | Left View | | | Right View | | |
| | L* | a* | b* | L* | a* | b* |
| No Color Film | 81.83 | −0.07 | 22.16 | 93.75 | −0.62 | 2.41 |
| Add Red Color Film | 67.68 | −0.05 | 14.79 | 75.87 | −0.44 | 1.71 |
| Add Blue Color Film | 54.61 | −0.04 | 10.83 | 58.84 | −0.32 | 1.23 |
| Add Gold Color Film | 63.09 | −0.04 | 13.49 | 70.47 | −0.41 | 1.57 |

TABLE 15

| | Dichroic Decoration Element 5 | | | | | |
|---|---|---|---|---|---|---|
| | Left View | | | Right View | | |
| | L* | a* | b* | L* | a* | b* |
| No Color Film | 61.08 | −2.14 | −4.22 | 81.83 | −0.07 | 22.16 |
| Add Red Color Film | 54.74 | −1.33 | −2.65 | 67.68 | −0.05 | 14.79 |
| Add Blue Color Film | 48.51 | −1.06 | −2.12 | 54.61 | −0.04 | 10.83 |
| Add Gold Color Film | 51.63 | −1.19 | −2.38 | 63.09 | −0.04 | 13.49 |

TABLE 16

| | Dichroic Decoration Element 6 | | | | | |
|---|---|---|---|---|---|---|
| | Left View | | | Right View | | |
| | L* | a* | b* | L* | a* | b* |
| No Color Film | 59.37 | 7.73 | 71.09 | 60.21 | 8.43 | 20.07 |
| Add Red Color Film | 53.15 | 4.65 | 30.66 | 54.07 | 5.20 | 11.57 |
| Add Blue Color Film | 43.38 | 3.14 | 19.18 | 46.06 | 3.87 | 8.43 |
| Add Gold Color Film | 49.81 | 4.18 | 26.98 | 50.68 | 4.68 | 10.33 |

Example 37

After forming a blue color film as in Example 1 on glass having a dichroic pattern as in FIG. 27, an aluminum oxynitride layer was formed as a light absorbing layer using reactive sputtering deposition. The deposition process was progressed under a vacuum condition of a base pressure of $3 \times 10^{-6}$ torr and a process pressure of 3 mtorr, Ar gas was adjusted to 100 sccm, and reactive gas $N_2$ was adjusted to 14 sccm. An aluminum layer was deposited on the light absorbing layer to a thickness of 100 nm as a light reflective layer. Results of comparing colors for the decoration member prepared as above observed through the glass are shown in FIG. 30.

Comparative Example 13

Preparation was performed in the same manner as in Example 37 except that the blue color film was not formed. Results of comparing colors for the decoration member prepared as above observed through the glass are shown in FIG. 30.

From FIG. 30, it was seen that the color difference between the high angle and the low angle was $\Delta E^*ab=9.88$ in Comparative Example 13, and the color difference between the high angle and the low angle was $\Delta E^*ab=8.99$ in Example 37. It was identified that colors appearing at the high angle and the low angle were able to be controlled while maintaining dichroic properties of the decoration member of Comparative Example 13 even when adding the blue color film.

The invention claimed is:

1. A decoration element comprising:
   a light reflective layer;
   a light absorbing layer provided on the light reflective layer, wherein the light absorbing layer comprises one or more regions in which an upper surface is inclined at an angle of greater than 0 degrees and less than or equal to 90 degrees, and the light absorbing layer comprises one or more regions having a thickness different from a thickness of any one region having the inclined surface; and
   a color developing layer comprising a color film, wherein the color developing layer is provided: on a surface of the light reflective layer opposite to a surface of the light reflective layer facing the light absorbing layer; between the light reflective layer and the light absorbing layer; or on a surface of the light absorbing layer opposite to a surface of the light absorbing layer facing the light reflective layer.

2. The decoration element of claim 1, wherein a color difference $\Delta E^*ab$ of the color developing layer is greater than 1 when the color film is present, and wherein the color difference $\Delta E^*ab$ is a difference in color coordinates L*a*b* in a color coordinate CIE L*a*b* of the color developing layer.

3. The decoration element of claim 1, wherein a substrate is provided on the surface of the light reflective layer opposite to the surface of the light reflective layer facing the light absorbing layer, and the color film is provided between the substrate and the light reflective layer or on a surface of the substrate opposite to a surface of the substrate facing the light reflective layer.

4. The decoration element of claim 1, wherein a substrate is provided on a surface of the light absorbing layer that is opposite to the surface of the light absorbing layer facing the light reflective layer, and the color film is provided between the substrate and the light absorbing layer or on a surface of the substrate opposite to a surface of the substrate facing the light absorbing layer.

5. The decoration element of claim 1, wherein the color film is provided as a single sheet, or as a laminate of a plurality of sheets, wherein the plurality of sheets may be the same or different types.

6. The decoration element of claim 1, wherein the light absorbing layer has dichroism when a color difference $\Delta E^*ab$ of the color developing layer is greater than 1, and wherein the color difference $\Delta E^*ab$ is a difference in color coordinates $L^*a^*b^*$ in a color coordinate CIE $L^*a^*b^*$ of the color developing layer.

7. The decoration element of claim 1, wherein an upper surface of the light absorbing layer comprises: a pattern having a cone-shaped protrusion or groove; or a pattern having a protrusion in which a highest point of the protrusion has a line shape or a groove in which the lowest point of the groove has a line shape.

8. The decoration element of claim 7, wherein, when observed from an upper surface, the pattern having a cone-shaped protrusion or groove comprises two or less cone-shaped protrusions or grooves having a similar shape when the cone-shaped pattern is rotated 360 degrees around a vertex of a cone of the pattern.

9. The decoration element of claim 7, wherein, when observed from an upper surface, the pattern having a protrusion in which the highest point of the protrusion has a line shape or a groove in which the lowest point of the groove has a line shape comprises protrusions and grooves having a same shape when the pattern is rotated 360 degrees around a center of gravity of an upper surface of the pattern.

10. The decoration element of claim 1, wherein the light absorbing layer has a refractive index of 0 to 8 at 380 nm to 780 nm.

11. The decoration element of claim 1, wherein the light absorbing layer has an extinction coefficient of greater than 0 and less than or equal to 4 at 400 nm.

12. The decoration element of claim 1, wherein the light reflective layer is a single layer or a multilayer comprising one or more materials selected from the group consisting of indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au), silver (Ag), oxides thereof, nitrides thereof, oxynitrides thereof, carbon and carbon composites.

13. The decoration element of claim 1, wherein the light absorbing layer is a single layer or a multilayer comprising one or more materials selected from the group consisting of indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), oxides thereof, nitrides thereof, oxynitrides thereof, carbon and carbon composites.

14. The decoration element of any one of claim 1, which is a deco film or a case of a mobile device.

* * * * *